(12) United States Patent
Cho et al.

(10) Patent No.: US 10,770,463 B2
(45) Date of Patent: Sep. 8, 2020

(54) SEMICONDUCTOR DEVICES INCLUDING STRUCTURES FOR REDUCED LEAKAGE CURRENT AND METHOD OF FABRICATING THE SAME

(71) Applicant: Samsung Electronics Co., Ltd., Suwon-si (KR)

(72) Inventors: Min Hee Cho, Suwon-si (KR); Jun Soo Kim, Seongnam-si (KR); Hui Jung Kim, Seongnam-si (KR); Tae Yoon An, Hwaseong-si (KR); Satoru Yamada, Yongin-si (KR); Won Sok Lee, Suwon-si (KR); Nam Ho Jeon, Hwaseong-si (KR); Moon Young Jeong, Suwon-si (KR); Ki Jae Hur, Seoul (KR); Jae Ho Hong, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/437,784

(22) Filed: Jun. 11, 2019

(65) Prior Publication Data
US 2019/0296017 A1 Sep. 26, 2019

Related U.S. Application Data

(63) Continuation of application No. 15/821,089, filed on Nov. 22, 2017, now Pat. No. 10,361,205.

(30) Foreign Application Priority Data

Apr. 12, 2017 (KR) .................. 10-2017-0047490

(51) Int. Cl.
*H01L 27/108* (2006.01)
*H01L 27/12* (2006.01)
(Continued)

(52) U.S. Cl.
CPC .... *H01L 27/10802* (2013.01); *H01L 21/7682* (2013.01); *H01L 21/84* (2013.01);
(Continued)

(58) Field of Classification Search
CPC ......... H01L 27/10876; H01L 27/10823; H01L 29/4236; H01L 29/42352; H01L 29/7825;
(Continued)

(56) References Cited

U.S. PATENT DOCUMENTS 8,053,832 B2 11/2011 Kim et al.
9,099,473 B2 8/2015 Kim et al.
(Continued)

FOREIGN PATENT DOCUMENTS

JP 2011192800 9/2011
KR 10-0546125 1/2006
(Continued)

*Primary Examiner* — Thanhha S Pham
(74) *Attorney, Agent, or Firm* — Muir Patent Law, PLLC

(57) ABSTRACT

A semiconductor device and a method for fabricating the same are provided. A semiconductor device having a substrate can include a lower semiconductor layer, an upper semiconductor layer on the lower semiconductor layer, and a buried insulating layer between the lower semiconductor layer and the upper semiconductor layer. A first trench can be in the upper semiconductor layer having a lowest surface above the buried insulating layer and a first conductive pattern recessed in the first trench. A second trench can be in the lower semiconductor layer, the buried insulating layer, and the upper semiconductor layer. A second conductive pattern can be in the second trench and a first source/drain region can be in the upper semiconductor layer between the first conductive pattern and the second conductive pattern.

13 Claims, 19 Drawing Sheets

(51) Int. Cl.
*H01L 21/84* (2006.01)
*H01L 29/423* (2006.01)
*H01L 21/768* (2006.01)

(52) U.S. Cl.
CPC .. *H01L 27/10814* (2013.01); *H01L 27/10823* (2013.01); *H01L 27/10844* (2013.01); *H01L 27/10876* (2013.01); *H01L 27/1203* (2013.01); *H01L 27/1207* (2013.01); *H01L 29/4236* (2013.01)

(58) Field of Classification Search
CPC ........... H01L 29/42336; H01L 27/1023; H01L 21/84; H01L 27/1207; H01L 27/10802; H01L 27/10885; H01L 27/10888; H01L 29/7841; H01L 27/10814; H01L 27/10844; H01L 27/10808; H01L 27/10847; H01L 27/1085; H01L 27/10852; H01L 27/10855
See application file for complete search history.

(56) References Cited

U.S. PATENT DOCUMENTS

| | | | |
|---|---|---|---|
| 9,349,858 B2 | 5/2016 | Hwang et al. | |
| 9,431,496 B2 | 8/2016 | Kang | |
| 9,437,697 B2 | 9/2016 | Cho | |
| 9,508,847 B2 | 11/2016 | Oh et al. | |
| 2013/0175595 A1* | 7/2013 | Cheng | H01L 21/84 257/304 |
| 2016/0056160 A1 | 2/2016 | Jang et al. | |
| 2016/0315088 A1 | 10/2016 | Kang et al. | |
| 2018/0108652 A1 | 4/2018 | Pan et al. | |

FOREIGN PATENT DOCUMENTS

| | | |
|---|---|---|
| KR | 100843883 | 7/2008 |
| KR | 20080081550 | 9/2008 |
| KR | 20160087667 | 7/2016 |

\* cited by examiner

SEMICONDUCTOR DEVICES INCLUDING STRUCTURES FOR REDUCED LEAKAGE CURRENT AND METHOD OF FABRICATING THE SAME

CROSS-REFERENCE TO RELATED APPLICATIONS

This application is a Continuation of U.S. patent application Ser. No. 15/821,089, filed on Nov. 22, 2017, now allowed, which claims priority under 35 U.S.C. § 119 to Korean Patent Application No. 10-2017-0047490 filed on Apr. 12, 2017 in the Korean Intellectual Property Office, the disclosure of each of which is incorporated herein by reference in its entirety.

BACKGROUND

The present inventive concept relates to a semiconductor device and a method for fabricating the same. Specifically, the present inventive concept relates to a semiconductor device including a buried insulating layer and a method for fabricating the same.

A buried channel array transistor (BCAT) may include a gate electrode buried in a trench to address short channel effects.

As semiconductor memory devices are increasingly highly integrated, the sizes of individual circuit patterns can be reduced to form more semiconductor devices in the same area, which may complicate fabrication of the semiconductor device. For example, miniaturization of the circuit patterns can cause an increase in leakage current. The leakage currents occur in various parts of the semiconductor device. For example, refresh characteristics of a DRAM (Dynamic Random Access Memory) may be adversely affected by increased leakage current.

SUMMARY

According to some aspects of the present inventive concept, there is provided a semiconductor device comprising a substrate including a lower semiconductor layer, an upper semiconductor layer on the lower semiconductor layer, and a buried insulating layer between the lower semiconductor layer and the upper semiconductor layer. A first trench can be in the upper semiconductor layer having a lowest surface above the buried insulating layer and a first conductive pattern recessed in the first trench. A second trench can be in the lower semiconductor layer, the buried insulating layer, and the upper semiconductor layer. A second conductive pattern can be in the second trench and a first source/drain region can be in the upper semiconductor layer between the first conductive pattern and the second conductive pattern.

According to some aspects of the present inventive concept, there is provided a semiconductor device comprising a substrate including a lower semiconductor layer, an upper semiconductor layer on the lower semiconductor layer, and a buried insulating layer between the lower semiconductor layer and the upper semiconductor layer. A first trench layer can have a lowest surface above the buried insulating layer and extending in a first direction in the upper semiconductor layer. A first conductive pattern can be recessed in the first trench and a second trench can extend in the first direction in the lower semiconductor layer, where the buried insulating layer and the upper semiconductor layer, and is connected to the first trench. A second conductive pattern can be recessed in the second trench and electrically connected to the first conductive pattern and a first source/drain region and a second source/drain region in the upper semiconductor layer can be on opposite sides of the first conductive pattern.

According to some aspects of the present inventive concept, there is provided a semiconductor device comprising a substrate including an upper semiconductor layer and a buried insulating layer beneath the upper semiconductor layer. A first conductive word line pattern of a first unit memory cell of the semiconductor device, can be located above the buried insulating layer in the first unit memory cell and a second conductive word line pattern of a second unit memory cell of the semiconductor device can be located adjacent to the first unit memory cell, where the second conductive word line pattern can extend adjacent to the first conductive word line pattern across the first unit memory cell and can be located beneath an upper surface of the buried insulating layer in the first unit memory cell.

DETAILED DESCRIPTION

Figure 1:
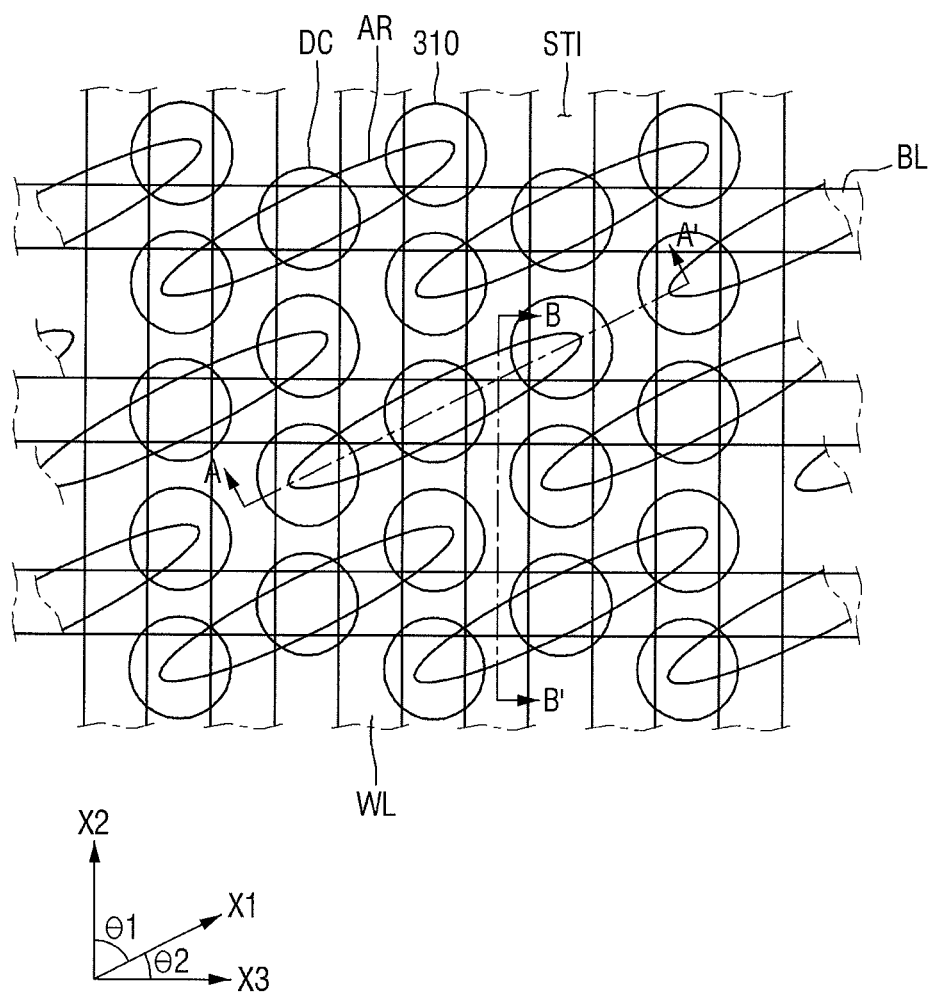
FIG. 1 is a layout diagram of a semiconductor device according to some embodiments of the present inventive concept.

FIG. 1 is a layout diagram of a semiconductor device according to some embodiments of the present inventive concept.

Referring to FIG. 1, a semiconductor device according to some embodiments of the present inventive concept includes a unit active region AR, an element isolation region STI, a word line WL, a bit line BL, a direct contact DC and a source/drain contact 310.

The unit active region AR may be defined by forming an element isolation region (STI; Shallow Trench Isolation) in the substrate (100 of FIG. 2A). Specifically, the unit active region AR may extend in the first direction X1.

The word line WL may extend in a second direction X2 forming an acute angle with the first direction X1, and the bit line BL may extend in a third direction X3 forming an acute angle with the first direction.

Here, the angle in the case where "a specific direction and another specific direction form a predetermined angle" means the smaller angle of the two angles formed by the intersection of the two directions. For example, when the angle that can be generated by intersection of the two directions is 120° and 60°, the "angle" is 60°. Therefore, as illustrated in FIG. 1, an angle formed by the first direction X1 and the second direction X2 is $\theta 1$, and an angle formed by the first direction X1 and the third direction X3 is $\theta 2$.

Figure 2A:
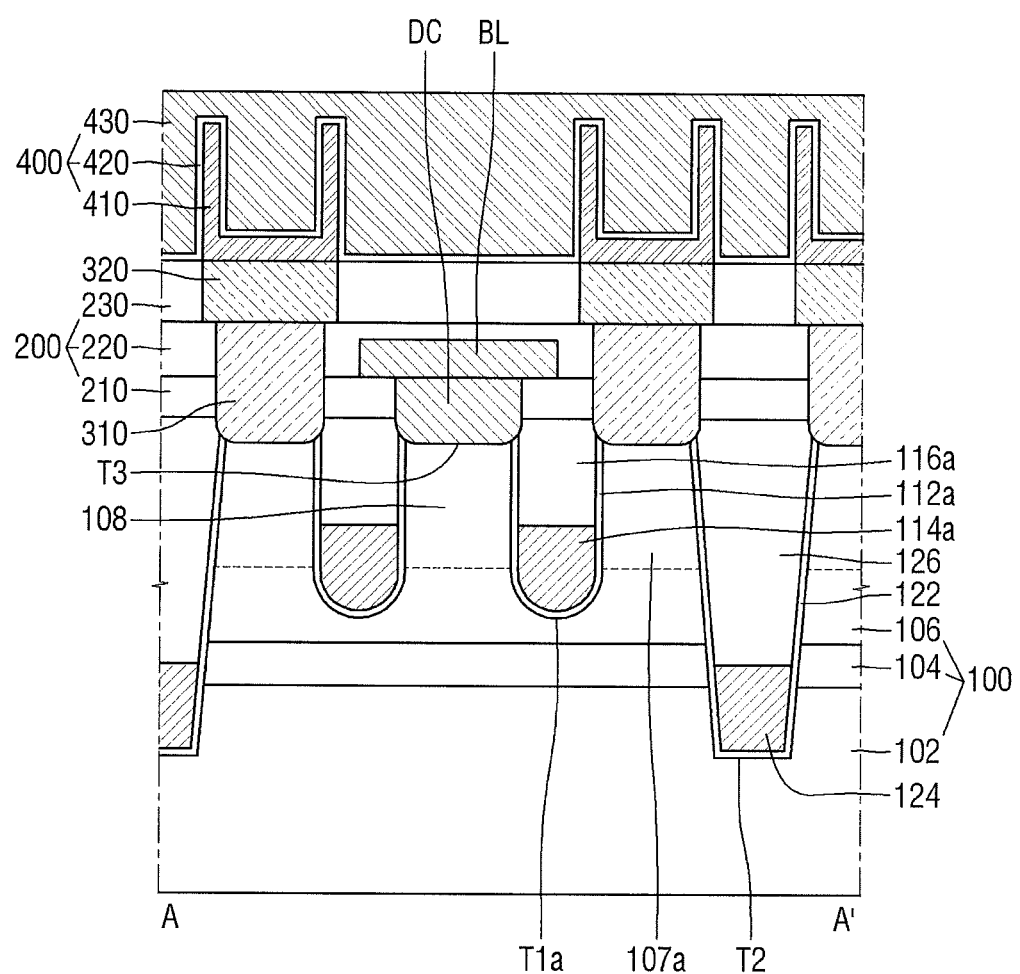
FIGS. 2A and 2B are views of a semiconductor device according to some embodiments of the present inventive concept.

The reason for making θ1 and/or θ2 form the acute angle is to maximally secure the interval between a direct contact DC connecting the unit active region AR and the bit line BL, and the source/drain contact 310 connecting the unit active region AR and the capacitor (400 in FIG. 2A).

θ1 and θ2 may be, for example, 60° and 30°, respectively. In such a case, the plurality of source/drain contacts 310 may be arranged in the form of a honeycomb. However, the present inventive concept is not limited thereto, and the source/drain contacts 310 may be arranged in various forms.

Hereinafter, a semiconductor device according to some embodiments of the present inventive concept will be described with reference to FIGS. 1 to 2B.

Figure 2B:
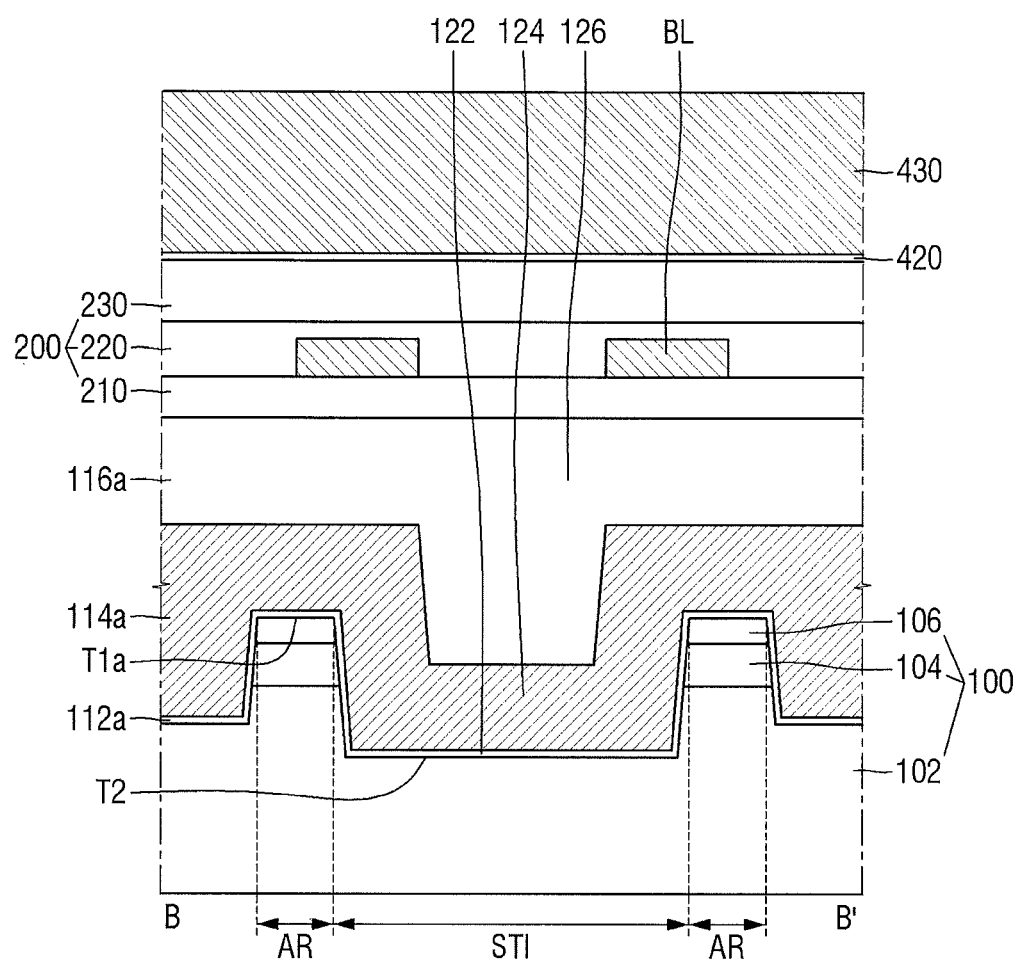

FIGS. 2A and 2B are views of a semiconductor device according to some embodiments of the present inventive concept. FIG. 2A is a cross-sectional view of some embodiments taken along a line A-A' of FIG. 1, and FIG. 2B is a view of some embodiments taken along a line B-B' of FIG. 1. Here, as an example of a semiconductor device according to some embodiments of the present inventive concept, a DRAM (dynamic random access memory) is illustrated, but the present inventive concept is not limited thereto.

Referring to FIGS. 1 to 2B, the semiconductor device according to the present embodiment includes a substrate 100, a first trench T1a, a second trench T2, a first source/drain region 107a, a second source/drain region 108, a first gate insulating layer 112a, a second gate insulating layer 122, a first conductive pattern 114a, a second conductive pattern 124, a first capping layer 116a, a second capping layer 126, an interlayer insulating layer 200, a buried contact 310, a landing pad 320, a capacitor 400, a third trench T3, a direct contact DC, and a bit line BL.

The substrate 100 is a substrate including a buried insulating layer (104; buried oxide). Specifically, the substrate 100 includes a lower semiconductor layer 102, a buried insulating layer 104, and an upper semiconductor layer 106. That is, the substrate 100 is a substrate in which the lower semiconductor layer 102, the buried insulating layer 104, and the upper semiconductor layer 106 may be sequentially formed. For example, the substrate 100 may be an SOI (Silicon On Insulator) substrate.

The lower semiconductor layer 102 and the upper semiconductor layer 106 may have a structure in which a base substrate and an epitaxial layer are laminated, but the present inventive concept is not limited thereto. The lower semiconductor layer 102 and the upper semiconductor layer 106 may include a silicon substrate, a gallium arsenide substrate, a silicon germanium substrate, a ceramic substrate, a quartz substrate, a glass substrate for display, or the like. Hereinafter, as an example, the lower semiconductor layer 102 and the upper semiconductor layer 106 are silicon substrates. In addition, the lower semiconductor layer 102 and the upper semiconductor layer 106 may be doped with impurities of a first conductivity type (e.g., P type) in some cases, but the present inventive concept is not limited thereto.

The first trench T1a and the second trench T2 may be formed inside the substrate 100. Here, the first trench T1a and the second trench T2 may be trenches formed in the substrate 100 to bury the gate electrode of the transistor. For example, the first trench T1a and the second trench T2 may be trenches formed in the substrate 100 to bury the word line WL of FIG. 1. That is, the first trench T1a and the second trench T2 may extend along the second direction (X2 in FIG. 1) within the substrate 100.

At this time, the first trench T1a may be a trench for burying an access gate of the word line WL, and the second trench T2 may be a trench for burying a pass gate of the word line WL. That is, the first trench T1a may be formed in a region of the substrate 100 overlapping the unit active region AR, and the second trench T2 may be formed in the region of the substrate overlapping the element isolation region STI.

As illustrated in FIGS. 1 and 2A, the second trench T2 may be arranged on one side of the first trench T1a. Specifically, the second trench T2 for burying a single word line WL may be adjacent to the first trench T1a for burying another word line WL adjacent to the word line WL. That is, the access gate of a single word line WL may be adjacent to the pass gate of another word line WL adjacent to the word line WL.

Further, as illustrated in FIGS. 1 and 2B, the first trench T1a and the second trench T2 may be connected to each other. Specifically, in order to bury a single word line WL extending along the second direction X2, the first trench T1a and the second trench T2 may be arranged in a row in the second direction X2. Since the word line WL alternately passes through the unit active region AR and the element isolation region STI, the first trench T1a and the second trench T2 may be alternately disposed along the second direction X2.

The first trench T1a according to this embodiment may be formed in the upper semiconductor layer 106. That is, the lowest surface of the first trench T1a may be higher than the upper surface of the buried insulating layer 104. At this time, the shapes of the first trench T1a may be various. For example, as illustrated, a connecting portion between the bottom surface and the sidewall of the first trench T1a may have a rounded shape. Alternatively, the side wall of the first trench T1a may have a shape that is inclined at a certain angle.

Unlike the first trench T1a, the second trench T2 may be formed in the lower semiconductor layer 102, the buried insulating layer 104 and the upper semiconductor layer 106. Specifically, the second trench T2 may extend from the upper surface of the upper semiconductor layer 106 through the upper semiconductor layer 106 and the buried insulating layer 104 to the lower semiconductor layer 102. That is, the lowest surface of the second trench T2 may be lower than the lower surface of the buried insulating layer 104. As a result, the lowest surface of the second trench T2 may be lower than the lowest surface of the first trench T1a.

As with the first trench T1a, the shapes of the second trench T2 may be various. For example, as illustrated, the side wall of the second trench T2 may have a shape that is inclined at a certain angle. Alternatively, the connecting portion between the bottom surface and the side wall of the second trench T2 may have a rounded shape.

The first source/drain region 107a and the second source/drain region 108 may be disposed on both sides of the first trench T1a. Specifically, the first source/drain region 107a may be formed in the upper semiconductor layer 106 on one side of the first trench T1a. Further, the second source/drain region 108 may be formed in the upper semiconductor layer 106 on the other side of the first trench T1a.

More specifically, the first source/drain region 107a may be formed in the upper semiconductor layer 106 between the first trench T1a and the second trench T2. That is, the first source/drain region 107a may be a part of the unit active region AR which is disposed between the access gate of a single word line WL and the pass gate of another word line WL adjacent to the word line WL.

When the upper semiconductor layer 106 is doped with an impurity of a first conductivity type (e.g., P type), the first source/drain region 107a and the second source/drain region 108 may be doped with an impurity of a conductivity type that is different from the first conductivity type. For example, the first source/drain region 107a and the second source/drain region 108 may be doped with an impurity of a second conductivity type (e.g., N type).

The first gate insulating layer 112a may be disposed on the first trench T1a. Specifically, the first gate insulating layer 112a may be disposed conformally along the side walls and the bottom surface of the first trench T1a. In addition, the first gate insulating layer 112a may not be formed on the upper surface of the substrate 100.

The second gate insulating layer 122 may be disposed on the second trench T2. Specifically, the second gate insulating layer 122 may be conformally disposed along the side walls and the bottom surface of the second trench T2. As a result, the lowest surface of the second gate insulating layer 122 may be lower than the lowest surface of the first gate insulating layer 112a. Further, the second gate insulating layer 122 may not be formed on the upper surface of the substrate 100.

As illustrated in FIG. 2B, the second gate insulating layer 122 may be disposed on the second trench T2 connected to the first trench T1a. In such a case, the first gate insulating layer 112a and the second gate insulating layer 122 may be connected to each other.

The first gate insulating layer 112a and the second gate insulating layer 122 may include at least one of a silicon oxide layer, a silicon nitride layer, a silicon oxynitride layer, or a high-dielectric constant material. Here, the high-dielectric constant material may include, for example, at least one of HfO2, ZrO2 or Ta2O5, but the present inventive concept is not limited thereto.

The first conductive pattern 114a may be disposed on the first gate insulating layer 112a. The first conductive pattern 114a may fill at least a part of the first trench T1a. For example, the first conductive pattern 114a may be formed in the first trench T1a so as to fill a part of the first trench T1a, without completely filling the first trench T1a. As a result, the upper surface of the first conductive pattern 114a may be lower than the upper surface (front surface) of the upper semiconductor layer 106. For example, the first conductive pattern 114a may be recessed relative to the upper surface of the upper semiconductor layer 106.

The second conductive pattern 124 may be disposed on the second gate insulating layer 122. The second conductive pattern 124 may fill at least a part of the second trench T2. For example, the second conductive pattern 124 may be formed in the second trench T2 so as to fill a part of the second trench T2, without completely filling the second trench T2. As a result, the upper surface of the second conductive pattern 124 may be lower than the upper surface (front surface) of the upper semiconductor layer 106. For example, the second conductive pattern 124 may be recessed relative to the upper surface of the upper semiconductor layer 106.

The upper surface of the second conductive pattern 124 may be lower than the upper surface of the first conductive pattern 114a. Furthermore, as illustrated in FIG. 2A, the upper surface of the second conductive pattern 124 may be lower than the upper surface of the buried insulating layer 104.

As illustrated in FIG. 2B, the second conductive pattern 124 may be disposed on a second trench T2 connected to the first trench T1a. In such a case, the first conductive pattern 114a and the second conductive pattern 124 may be connected to each other (e.g., formed of a continuous layer). That is, in such a case, the first conductive pattern 114a and the second conductive pattern 124 may be connected to each other to form a single word line WL of FIG. 1.

The first conductive pattern 114a and the second conductive pattern 124 may include a conductive material. For example, the first conductive pattern 114a may include metal, polysilicon, or the like, but the present inventive concept is not limited thereto.

The first capping layer 116a may be disposed on the first conductive pattern 114a. Specifically, the first capping layer 116a may be disposed on the upper surface of the first conductive pattern 114a and the side walls of the first gate insulating layer 112a. The first capping layer 116a may be formed to fill the first trench T1a. Also, the upper surface of the first capping layer 116a may be disposed on the substantially same plane as the upper surface of the upper semiconductor layer 106.

The second capping layer 126 may be disposed on the second conductive pattern 124. Specifically, the second capping layer 126 may be disposed on the upper surface of the second conductive pattern 124 and the side walls of the second gate insulating layer 122. The second capping layer 126 may be formed to fill the second trench T2. As a result, the lower surface of the second capping layer 126 may be lower than the lower surface of the first capping layer 116a. However, the upper surface of the second capping layer 126 may be disposed on the substantially same plane as the upper surface of the first capping layer 116a.

As illustrated in FIG. 2B, the second capping layer 126 may also be disposed on the second trench T2 connected to the first trench T1a. In such a case, the first capping layer 116a and the second capping layer 126 may be connected to each other.

The first capping layer 116a and the second capping layer 126 may include, for example, an oxide film, a nitride film, an oxynitride film, or a combination thereof, but the present inventive concept is not limited thereto.

The interlayer insulating layer 200 may be disposed on the substrate 100. The interlayer insulating layer 200 may be a single layer, but may also include a plurality of layers. For example, as illustrated in FIG. 2A, the interlayer insulating layer 200 may include first to third interlayer insulating layers 210, 220, and 230 sequentially formed.

The interlayer insulating layer 200 may include, for example, at least one of silicon oxide, silicon nitride and silicon oxynitride. However, the present inventive concept is not limited thereto.

The buried contact 310 is buried in the interlayer insulating layer 200 and may be connected to the first source/drain region 107a. For example, as illustrated in FIG. 2A, the buried contact 310 extends from the upper surface of the second interlayer insulating layer 220, penetrates through the first and second interlayer insulating layers 210 and 220, and may be connected to the first source/drain region 107a.

Further, the buried contact 310 may contain a conductive material and may be electrically connected to the first source/drain region 107a. For example, the buried contact 310 may contain polysilicon. Here, the polysilicon may be polysilicon doped with impurities. Also, the buried contact 310 may include metal, metal silicide, metal nitride, or a combination thereof.

The landing pad 320 is disposed on the buried contact 310 and may be connected to the buried contact 310. For example, as illustrated in FIG. 2A, the landing pad 320 is disposed on the second interlayer insulating layer 220 and may be connected to the buried contact 310.

In addition, the landing pad 320 may include a conductive material and may be electrically connected to the buried contact 310. For example, the landing pad 320 may include tungsten (W), but the present inventive concept is not limited thereto.

A capacitor 400 is disposed on the landing pad 320 and may be connected to the landing pad 320. For example, as illustrated in FIG. 2A, the capacitor 400 is disposed on the third interlayer insulating layer 230 and may be connected to the landing pad 320. As a result, the capacitor 400 may be electrically connected to the first source/drain region 107a.

The capacitor 400 may store charges in a semiconductor memory device or the like. Specifically, the capacitor 400 may include a lower electrode 410, a capacitor dielectric layer 420, and an upper electrode 430. The capacitor 400 may store electric charge in the capacitor dielectric film 420, by utilizing the potential difference generated between the lower electrode 410 and the upper electrode 430.

The lower electrode 410 and the upper electrode 430 may include, for example, doped polysilicon, metal or metal nitride. Also, the capacitor dielectric layer 420 may include, for example, silicon oxide or a high-dielectric constant material. However, the present inventive concept is not limited thereto.

The third trench T3 may be formed in the substrate 100 on the other side of the first trench T1a. Specifically, the third trench T3 may be formed in the upper semiconductor layer 106 over the second source/drain region 108. Here, the third trench T3 may be a trench for burying the electrical contact which connects the bit line BL and the second source/drain region 108. For example, the third trench T3 may be a trench formed in the substrate 100 to bury the direct contact DC of FIG. 1.

Specifically, the direct contact DC may fill the third trench T3. For example, the direct contact DC extends from the upper surface of the first interlayer insulating layer 210, passes through the first interlayer insulating layer 210, and may be formed so as to completely fill the third trench T3. However, the present inventive concept is not limited thereto, and the direct contact DC may have various shapes which electrically connects the second source/drain region 108 and the bit line BL.

In some embodiments, the third trench T3 may overlap the first gate insulating layer 112a and/or the first capping layer 116a, but the present inventive concept is not limited thereto.

With high integration of semiconductor device, leakage current may occur in various parts of the semiconductor device. However, the semiconductor device according to some embodiments may reduce the leakage current in the highly integrated semiconductor devices.

For example, in conventional arrangements a junction leakage induced by the gate may occur under the buried channel array transistor. However, in some embodiments, the first conductive pattern 114a forming the access gate may be formed on the buried insulating layer 104 to prevent such a junction leakage. That is, the buried insulating layer 104 may be disposed under the first conductive pattern 114a to help prevent the formation of a junction which generates a leakage current under the gate of the buried channel array transistor.

Further, the buried insulating layer 104 may prevent the junction leakage formed in the source/drain. Specifically, a depletion region formed on the upper semiconductor layer 106 by the buried insulating layer 104 may reduce the junction leakage formed in the source/drain.

Also, when the source/drain regions and the gates are disposed adjacent to each other, a strong electric field may be generated between them. As a result, direct tunneling between the source/drain region and the gate may occur, and the leakage current caused thereby may be referred to as a gate induced drain leakage (GIDL). With the high integration of semiconductor devices, the gate induced drain leakage can be generated in the pass gate as well as the access gate. However, in some embodiments, the upper surface of the second conductive pattern 124 may be disposed to be lower than the upper surface of the first conductive pattern 114a to prevent the gate induced drain leakage. The gate induced drain leakage can depend on the overlap area between the source/drain region and the gate. The reason is that the second conductive pattern 124 disposed to be lower than the first conductive pattern 114a may reduce such an overlap area. Furthermore, the upper surface of the second conductive pattern 124 may be disposed to be lower than the upper surface of the buried insulating layer 104. In such a case, the second conductive pattern 124 may be disposed away from the source/drain region, thereby reducing the gate induced drain leakage generated in the pass gate.

Figure 3A:
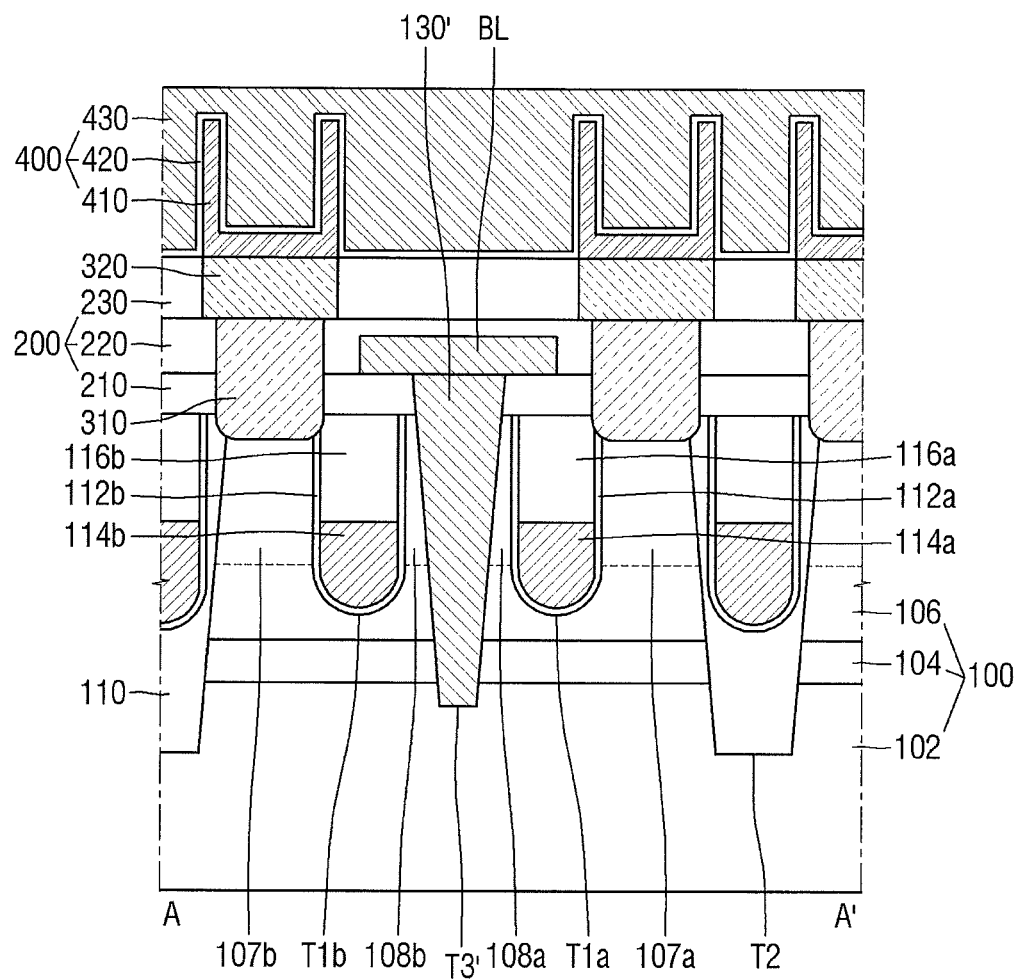
FIGS. 3A and 3B are views of a semiconductor device according to some embodiments of the present inventive concept.
Figure 3B:
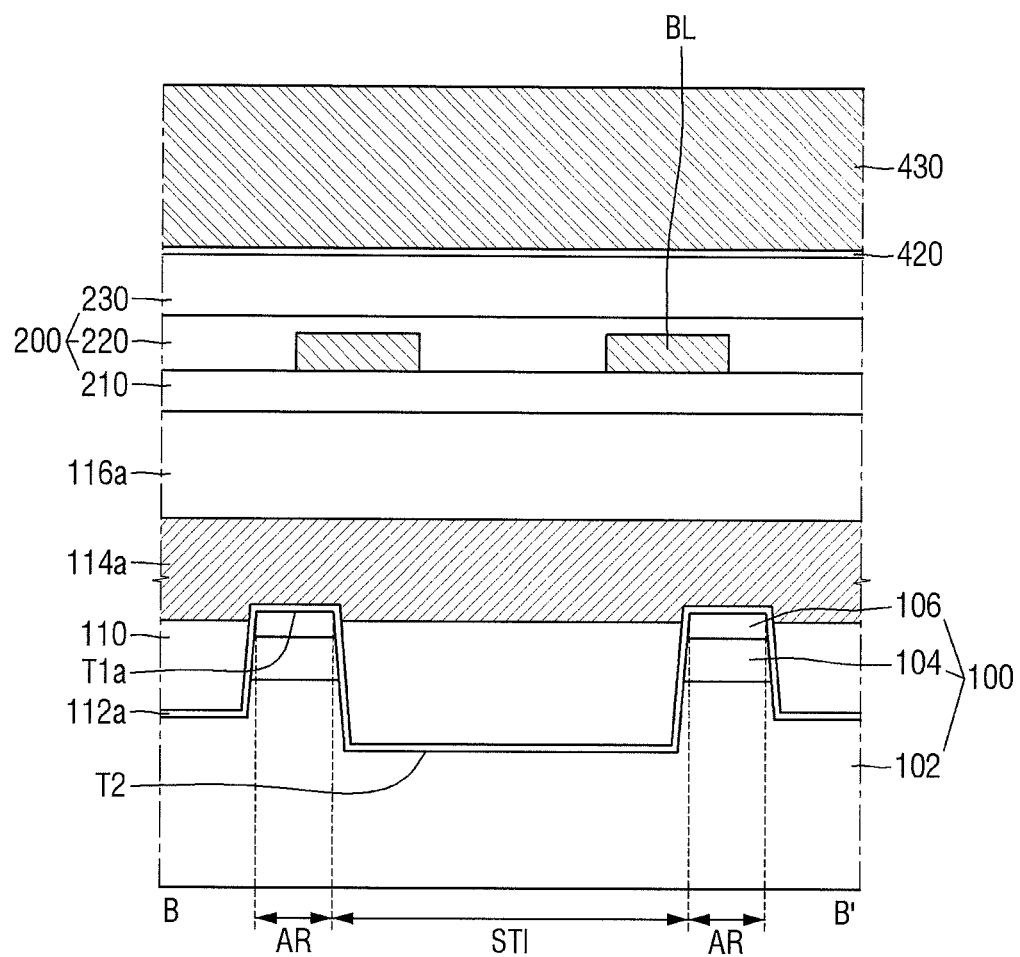

Hereinafter, the semiconductor device according to some embodiments of the present inventive concept will be described with reference to FIGS. 1, 3A and 3B. FIGS. 3A and 3B are views of a semiconductor device according to some embodiments of the present inventive concept. FIG. 3A is a cross-sectional view of some embodiments taken along a line A-A' of FIG. 1, and FIG. 3B is a view of some embodiments taken along a line B-B' of FIG. 1.

Referring to FIGS. 1, 3A and 3B, the semiconductor device according to the present embodiment includes an element isolation layer 110, a third trench T3', a third conductive pattern 130', a third source/drain region 108a, a fourth source/drain region 108b, a fourth trench T1b, a fourth gate insulating layer 112b, a fourth conductive pattern 114b, a fourth capping layer 116b, and a fifth source/drain region 107b.

The element isolation film 110 may fill the second trench T2. For example, the element isolation film 110 may be formed so as to completely fill the second trench T2.

The element isolation layer 110 may include an insulating material. For example, the element isolation film 110 may include an oxide film, a nitride film, or a combination thereof, but the present inventive concept is not limited thereto. The element isolation film 110 may be a single layer made of one type of insulating material or may be multi-layers made up of combinations of various kinds of insulating materials.

As described above in the description of FIGS. 2A and 2B, the second trench T2 may be a trench for burying the pass gate of the word line WL. However, unlike the semiconductor device according to FIGS. 2A and 2B, the pass gate of the semiconductor device according to this embodiment may be buried in the element isolation film 110. That is, as illustrated in FIGS. 1 and 3B, the first conductive pattern 114a may extend along the second direction X2. Likewise, the first capping layer 116a may extend along the second direction X2.

In the present example, the lowest surface of the first conductive pattern 114a on the element isolation region STI is illustrated as being lower than the lowest surface of the first conductive pattern 114a on the unit active region AR. The reason is that the first trench T1a and the second trench T2 for burying the word line WL may be simultaneously formed on the substrate 100 on which the element isolation film 110 is formed. That is, this is due to the fact that the substrate 100 of the unit active region AR and the substrate 100 of the element isolation region STI have different etching rates. The present inventive concept is not limited thereto. That is, the lowest surface of the first conductive pattern 114*a* on the element isolation region STI may be present on the same plane as the lowest surface of the first conductive pattern 114*a* on the unit active region AR, and may be higher than the lowest surface of the first conductive pattern 114*a* on the unit active region AR, depending on the etching rate.

The third trench T3' may correspond to the third trench T3 of FIG. 2A. That is, the third trench T3' may be formed in the substrate 100 on the other side of the first trench T1*a*.

However, the third trench T3' may be formed in the lower semiconductor layer 102, the buried insulating layer 104 and the upper semiconductor layer 106. Specifically, the third trench T3' extends from the upper surface of the upper semiconductor layer 106, passes through the upper semiconductor layer 106 and the buried insulating layer 104, and may extend to the lower semiconductor layer 102. That is, the lowest surface of the third trench T3' may be lower than the lowest surface of the first trench T1*a*.

There may be several shapes of the third trench T3'. For example, as illustrated, the side wall of the third trench T3' may have a shape that is inclined at a certain angle. Alternatively, the connecting portion between the bottom surface and the side wall of the third trench T3' may have a rounded shape.

The fourth trench T1*b* may be disposed on one side of the third trench T3'. Specifically, a first trench T1*a* may be disposed on one side of the third trench T3', and a fourth trench T1*b* may be disposed on the other side of the third trench T3'. That is, the third trench T3' may be interposed between the first trench T1*a* and the fourth trench T1*b*.

The fourth trench T1*b* may be formed in the substrate 100. Here, the fourth trench T1*b* may be a trench formed in the substrate 100 to bury the gate electrode of the transistor. Also, the fourth trench T1*b* may be a trench for burying the access gate of the word line WL. That is, the fourth trench T1*b* may be formed in the region of the substrate 100 overlapping the unit active region AR. The fourth trench T1*b* may have substantially the same shape as the first trench T1*a*.

The third source/drain region 108*a* and the fourth source/drain region 108*b* may be disposed on both sides of the third trench T3'. Specifically, the third source/drain region 108*a* may be formed in the upper semiconductor layer 106 on one side of the third trench T3'. In addition, the fourth source/drain region 108*b* may be formed in the upper semiconductor layer 106 on the other side of the third trench T3'.

More specifically, the third source/drain region 108*a* may be formed in the upper semiconductor layer 106 between the first trench T1*a* and the third trench T3'. In addition, the fourth source/drain region 108*b* may be formed in the upper semiconductor layer 106 between the third trench T3' and the fourth trench T1*b*.

The fifth source/drain region 107*b* may be disposed on one side of the fourth trench T1*b*. Specifically, the fourth source/drain region 108*b* and the fifth source/drain region 107*b* may be disposed on opposite sides of the fourth trench T1*b*.

The fifth source/drain region 107*b* may be substantially the same as the first source/drain region 107*a*. That is, the fifth source/drain region 107*b* may be electrically connected to the capacitor 400. Therefore, in some embodiments, two semiconductor memory devices may be formed in a single unit active region AR. However, the present inventive concept is not limited thereto, and one or two or more semiconductor memory devices may be formed in a single unit active region AR.

The third conductive pattern 130' may correspond to the direct contact DC of FIG. 2A. That is, the third conductive pattern 130' may fill the third trench T3'. For example, the third conductive pattern 130' may be formed to extend from the upper surface of the first interlayer insulating layer 210, pass through the first interlayer insulating layer 210, and completely fill the third trench T3'.

As a result, the upper surface of the third conductive pattern 130' may be higher or the same as the upper surface of the upper semiconductor layer. Also, the lower surface of the third conductive pattern 130' may be lower than or the same as the upper surface of the lower semiconductor layer.

That is, the third conductive pattern 130' may have a shape extending from the bit line BL to the lower semiconductor layer 102. As a result, the third conductive pattern 130' may electrically connect the third source/drain region 108*a* and the bit line BL. In addition, the third conductive pattern 130' may electrically connect the fourth source/drain region 108*b* and the bit line BL. That is, the third source/drain region 108*a* and the fourth source/drain region 108*b* may share the third conductive pattern 130'. Further, the third conductive pattern 130' may electrically connect the upper semiconductor layer 106 and the lower semiconductor layer 102.

The fourth gate insulating layer 112*b* may be disposed on the fourth trench T1*b*. In this embodiment, the fourth gate insulating layer 112*b* may be substantially the same as the first gate insulating layer 112*a*.

The fourth conductive pattern 114*b* may be disposed on the fourth gate insulating layer 112*b*. In the present embodiment, the fourth conductive pattern 114*b* may be substantially the same as the first conductive pattern 114*a*.

The fourth capping layer 116*b* may be disposed on the fourth conductive pattern 114*b*. In the present embodiment, the fourth capping layer 116*b* may be substantially the same as the first capping layer 116*a*.

A floating body effect, in which the channel region of the transistor is isolated from the substrate, may occur in a buried insulating layer, if unaddressed. The floating body effect makes the body of the transistor have no constant voltage value, making it difficult to control the threshold voltage of the transistor. Such a floating body effect may occur when charges are accumulated in the substrate on the buried insulating layer. For example, the floating body effect may occur in the NMOS device by accumulation of holes in the substrate on the buried insulating layer.

However, in some embodiments, the third conductive pattern 130' may extend to the lower semiconductor layer 102 to remove the floating body effect. That is, the third conductive pattern 130' may electrically connect the upper semiconductor layer 106 and the lower semiconductor layer 102 to discharge electric charges accumulated in the upper semiconductor layer 106 to the lower semiconductor layer 102.

In addition, the third conductive pattern 130' may be interposed between the first conductive pattern 114*a* and the fourth conductive pattern 114*b* to prevent disturbance between the word lines. More specifically, the first conductive pattern 114*a* may form a single word line WL, and the fourth conductive pattern 114*b* may form another word line WL adjacent to the word line WL. That is, the third conductive pattern 130' may be interposed between the adjacent word lines WL to reduce interference between the word lines WL.

In addition, the third conductive pattern 130' may have a shape extending from the bit line BL to the lower semiconductor layer 102. As a result, the resistance of the third conductive pattern 130' is reduced, which makes it possible to improve the performance as a contact electrically connected to the bit line BL.

Figure 4:
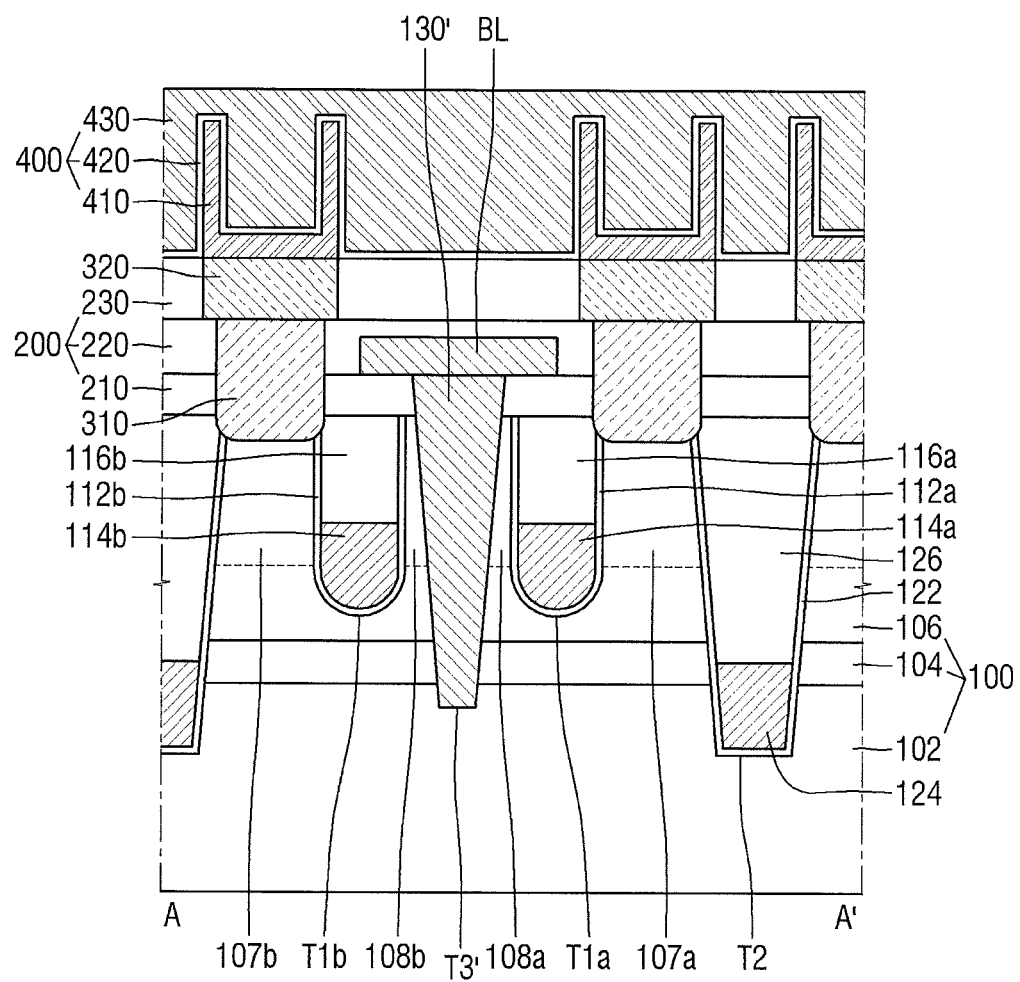
FIG. 4 is a view of a semiconductor device according to some embodiments of the present inventive concept.

As a result, the semiconductor device according to some embodiments may provide a semiconductor device with improved performance Hereinafter, a semiconductor device according to some embodiments of the present inventive concept will be described with reference to FIGS. 1 and 4. FIG. 4 is a diagram for explaining a semiconductor device according to some embodiments of the present inventive concept. FIG. 4 is a cross-sectional view illustrating some embodiments taken along a line A-A' of FIG. 1.

Referring to FIGS. 1 and 4, the semiconductor device according to the present embodiment is substantially the same as the semiconductor device according to FIGS. 3A and 3B, except a configuration in which a second gate insulating layer 122, a second conductive pattern 124 and a second capping layer 126 are formed in a second trench T2.

In some embodiments, the second gate insulating layer 122, the second conductive pattern 124 and the second capping layer 126 are the same as those described above with reference to FIGS. 2A and 2B.

As a result, the semiconductor device according to the present embodiment may reduce the leakage current in a highly integrated semiconductor device. In addition, the semiconductor device according to the present embodiment may provide a semiconductor device with improved performance.

Figure 5:
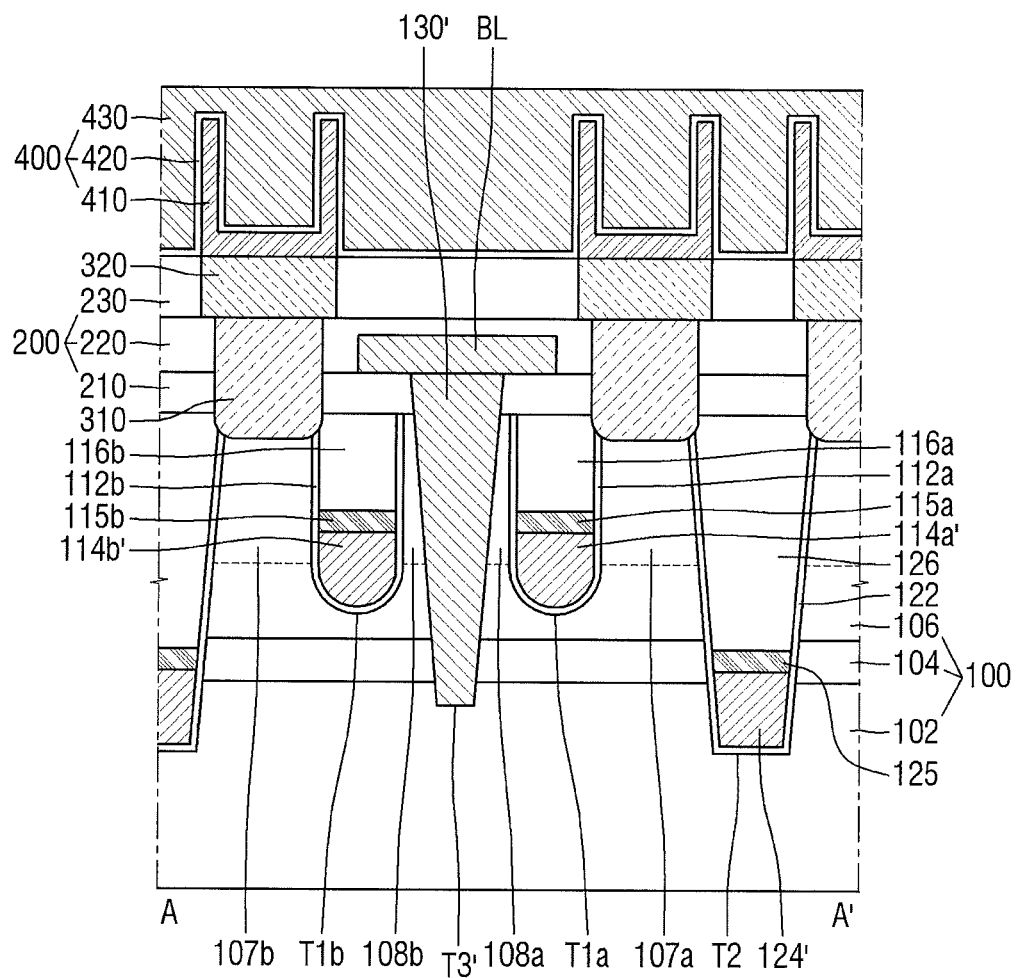
FIG. 5 is a view of a semiconductor device according to some embodiments of the present inventive concept.

Hereinafter, a semiconductor device according to some embodiments of the present inventive concept will be described with reference to FIGS. 1 and 5. FIG. 5 is a diagram for explaining a semiconductor device according to some embodiments of the present inventive concept. FIG. 5 is a cross-sectional view illustrating some embodiments taken along a line A-A' of FIG. 1.

Referring to FIGS. 1 and 5, the semiconductor device according to this embodiment is substantially the same as the semiconductor device according to FIG. 4, except further including a fifth conductive pattern 115a, a sixth conductive pattern 125, and a seventh conductive pattern 115b.

The fifth conductive pattern 115a may be disposed on the first conductive pattern 114a'. The fifth conductive pattern 115a may fill at least a part of the first trench T1a. For example, the fifth conductive pattern 115a may be formed in the first trench T1a to fill a part of the first trench T1a, without completely filling the first trench T1a. As a result, the upper surface of the fifth conductive pattern 115a may be lower than the upper surface of the upper semiconductor layer 106. For example, the fifth conductive pattern 115a may be in a recessed form.

The work function of the fifth conductive pattern 115a may be less than the work function of the first conductive pattern 114a'. Specifically, the first conductive pattern 114a' may include a high work function material, and the fifth conductive pattern 115a may include a low work function material. For example, the first conductive pattern 114a' may include a material having a greater work function than a mid-gap work function (4.5 eV) of silicon, and the fifth conductive pattern 115a may include a material having a work function less than this.

For example, the first conductive pattern 114a' may include metal nitride. For example, the first conductive pattern 114a' may include titanium nitride (TiN), titanium aluminum nitride (TiAlN), aluminum doped titanium nitride (Al doped TiN), or a combination thereof.

For example, the fifth conductive pattern 115a may include a metal compound or metal carbide. For example, the fifth conductive pattern 115a may include titanium aluminum (TiAl), titanium carbide (TiC), titanium aluminum carbide (TiAlC), fluorine free tungsten (FFW), or a combination thereof.

The sixth conductive pattern 125 may be disposed on the second conductive pattern 124'. At this time, the sixth conductive pattern 125 may fill at least a part of the second trench T2. For example, the sixth conductive pattern 125 may be formed in the second trench T2 so as to fill a part of the second trench T2, without completely filling the second trench T2. As a result, the upper surface of the sixth conductive pattern 125 may be lower than the upper surface of the upper semiconductor layer 106. For example, the sixth conductive pattern 125 may be in a recessed form.

The upper surface of the sixth conductive pattern 125 may be lower than the upper surface of the fifth conductive pattern 115a. Furthermore, as illustrated in FIG. 5, the upper surface of the sixth conductive pattern 125 may be lower than the upper surface of the buried insulating layer 104.

In some embodiments, the second conductive pattern 124' may include the same material as the first conductive pattern 114a'. Also, the sixth conductive pattern 125 may include the same material as the fifth conductive pattern 115a.

The seventh conductive pattern 115b may be disposed on the fourth conductive pattern 114b'. The seventh conductive pattern 115b may fill at least a part of the fourth trench T1b. The seventh conductive pattern 115b may have substantially the same shape as that of the fifth conductive pattern 115a.

In some embodiments, the fourth conductive pattern 114b' may include the same material as the first conductive pattern 114a'. In addition, the seventh conductive pattern 115b may include the same material as the fifth conductive pattern 115a.

The conductive pattern including the high work function material may adjust the threshold voltage. For example, the first conductive pattern 114a' contains a high work function material to enhance the threshold voltage, and may lower the channel dose of the transistor. As a result, the first conductive pattern 114a' containing the high work function material may reduce the leakage current.

Also, the conductive pattern including a low work function material may reduce the gate induced drain leakage. As described above, the gate induced drain leakage is caused by the electric field generated between the source/drain region and the gate. As a result, the conductive pattern including the low work function material may reduce such an electric field to reduce the gate induced drain leakage. For example, the fifth conductive pattern 115a may overlap the first source/drain region 107a and the third source/drain region 108a. Further, since the fifth conductive pattern 115a includes a low work function material, the gate induced drain leakage can be reduced.

Thus, in the semiconductor device according to the present embodiment, the leakage current can be further reduced in the highly integrated semiconductor device. In addition, the semiconductor device according to the present embodiment may provide a semiconductor device with improved performance.

Figure 6:
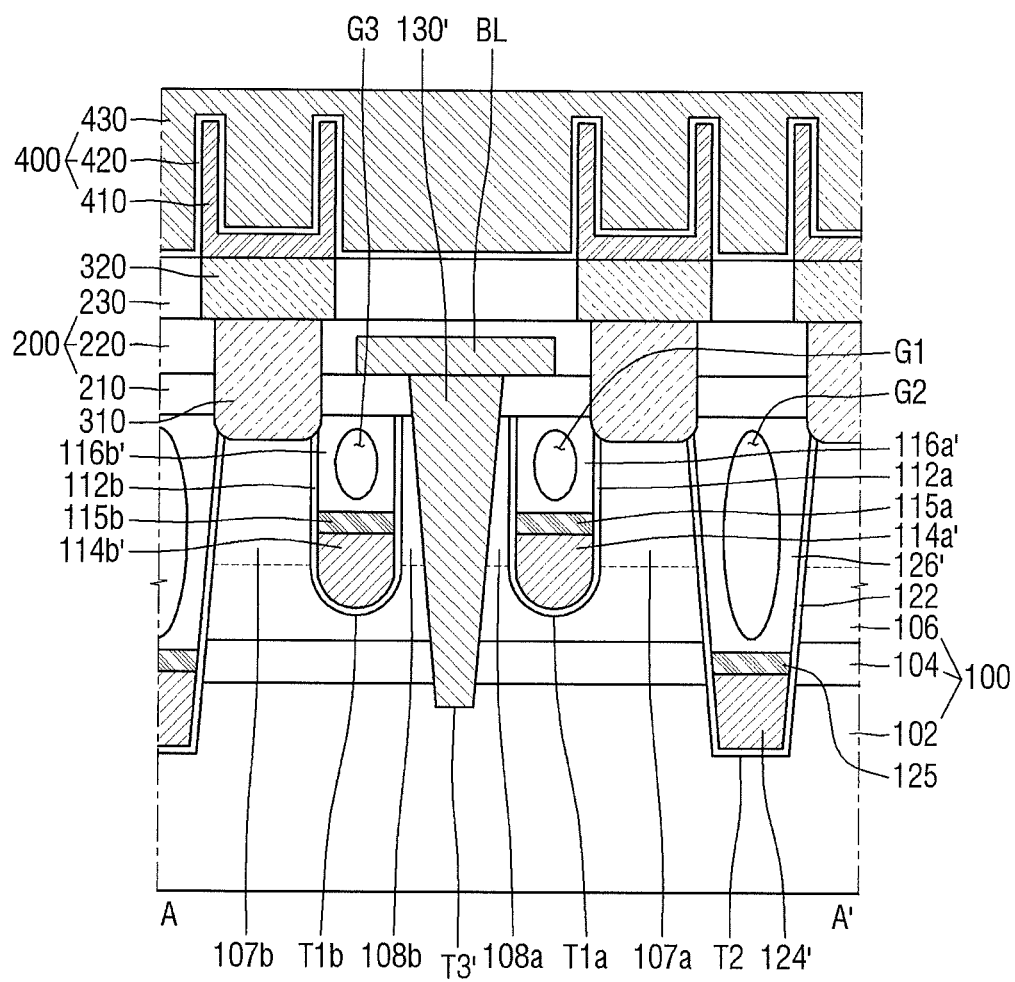
FIG. 6 is a view of a semiconductor device according to some embodiments of the present inventive concept.

Hereinafter, a semiconductor device according to some embodiments of the present inventive concept will be described with reference to FIGS. 1 and 6. FIG. 6 is a view for explaining a semiconductor device according to some embodiments of the present inventive concept. FIG. 6 is a view illustrating some embodiments taken along a line A-A' of FIG. 1.

Referring to FIGS. 1 and 6, the semiconductor device according to the present embodiment is substantially the same as that of the semiconductor device according to FIG. 5, except including a first capping layer 116a', a second capping layer 126' and a third capping layer 116b'.

The first to third capping layer 116a', 126', and 116' include an air gap. Specifically, unlike the first capping layer 116a of FIG. 5, the first capping layer 116a' may include a first air gap G1. The first air gap G1 may extend in the first capping layer 116a' along the second direction X2.

In FIG. 6, the first air gap G1 is illustrated as an oval shape, but the present inventive concept is not limited thereto. That is, the first air gap G1 may have various shapes depending on the forming process. Also, a plurality of first air gaps G1 may exist in the first capping layer 116a'.

Unlike the second capping layer 126 of FIG. 5, the second capping layer 126' may include a second air gap G2. The second air gap G2 may be larger than the first air gap G1. The second air gap G2 may extend in the second capping layer 126' along the second direction X2. Like the first air gap G1, the second air gap G2 may have various shapes. Also, a plurality of second air gaps G2 may exist in the second capping layer 126'.

Unlike the third capping layer 116b in FIG. 5, the third capping layer 116b' may include a third air gap G3. The third air gap G3 may be substantially the same as the first air gap G1.

With the high integration of the semiconductor devices, the distance between the conductive patterns of the semiconductor device may be reduced. This may increase the parasitic capacitance between the conductive patterns, and the performance of the semiconductor device may be degraded. However, the semiconductor device according to some embodiments may include an air gap having a low dielectric constant to reduce the parasitic capacitances.

Thus, the semiconductor device according to the present embodiment may further reduce the leakage current in the highly integrated semiconductor device. In addition, the semiconductor device according to the present embodiment may provide a semiconductor device with improved performance.

Hereinafter, a method for fabricating a semiconductor device according to some embodiments of the present inventive concept will be described with reference to FIGS. 7 to 18. FIGS. 7 to 18 are views of intermediate structures formed during fabrication of a semiconductor device according to some embodiments of the present inventive concept. FIGS. 7 to 14A are intermediate cross-sectional views according to some embodiments taken along the line A-A' of FIG. 1. Also, FIGS. 4B to 14B are intermediate cross-sectional views according to some embodiments taken along the line B-B' of FIG. 1.

Figure 7:
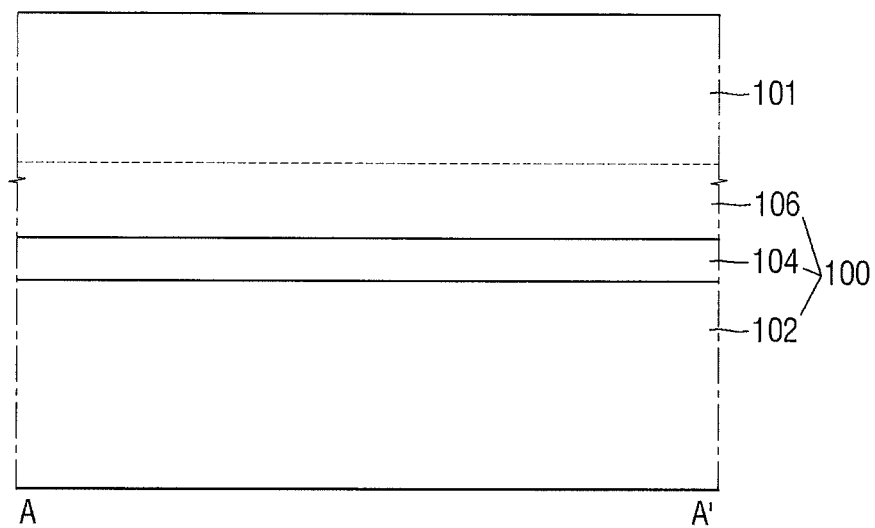
FIGS. 7 to 18 are views of intermediate structures formed during methods of fabricating a semiconductor device according to some embodiments of the present inventive concept.

Referring to FIG. 7, there is provided a substrate in which a lower semiconductor layer 102, a buried insulating layer 104, and an upper semiconductor layer 106 are sequentially formed. For example, an SOI (Silicon On Insulator substrate) may be provided.

The lower semiconductor layer 102 and the upper semiconductor layer 106 may be doped with an impurity of a first conductivity type (for example, P type). Further, the upper part of the upper semiconductor layer 106 may be doped with an impurity of a second conductivity type (for example, N type). Therefore, the preliminary source/drain region 101 may be formed on the upper semiconductor layer 106.

Figure 8A:
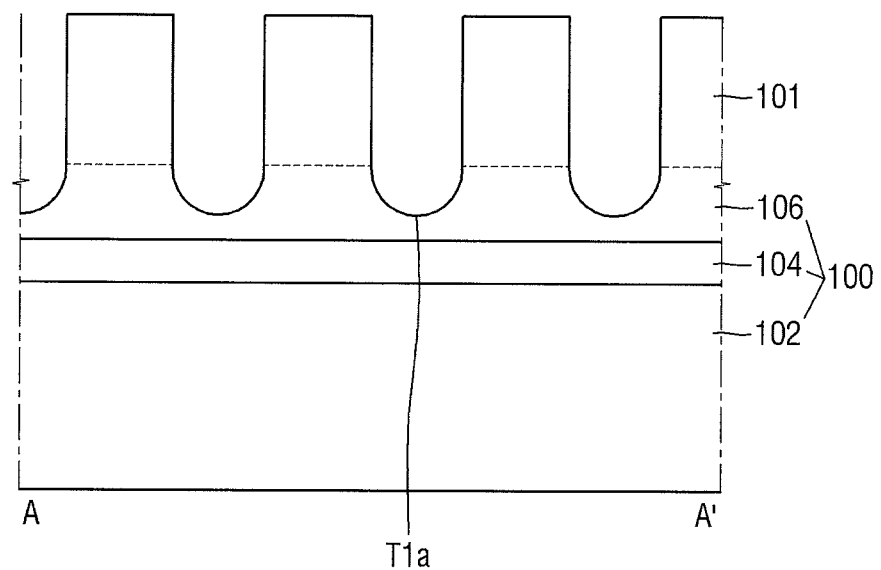
Figure 8B:
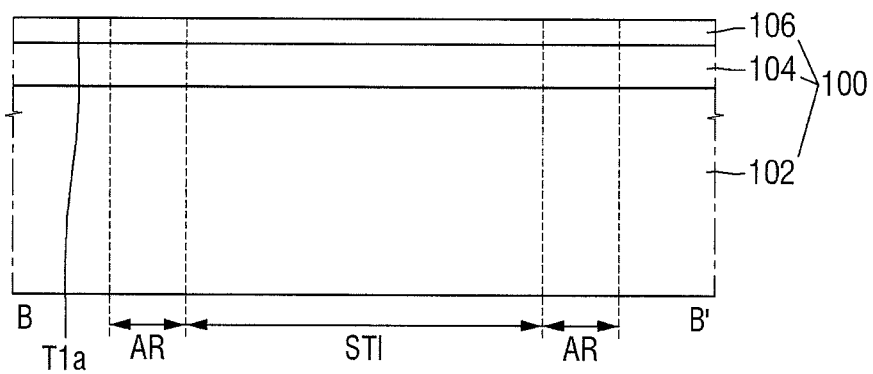

Referring to FIGS. 1, 8A and 8B, a first trench T1a is formed in the upper semiconductor layer 106. The first trench T1a may extend along the second direction X2. Thus, the first source/drain 107a and the second source/drain region 108 may be formed on both sides of the first trench T1a.

The first trench T1a may be formed, using an etching process. For example, the first trench T1a may be formed, using a dry etching process. Specifically, a mask pattern may be formed on the upper semiconductor layer 106. The mask pattern may expose a region in which the first trench T1a is formed. The mask pattern may include an oxide film, a nitride film, an oxynitride film, or a combination thereof, but the present inventive concept is not limited thereto. Subsequently, the portion exposed by the mask pattern may be etched to form the first trench T1a inside the upper semiconductor layer 106.

Figure 9A:
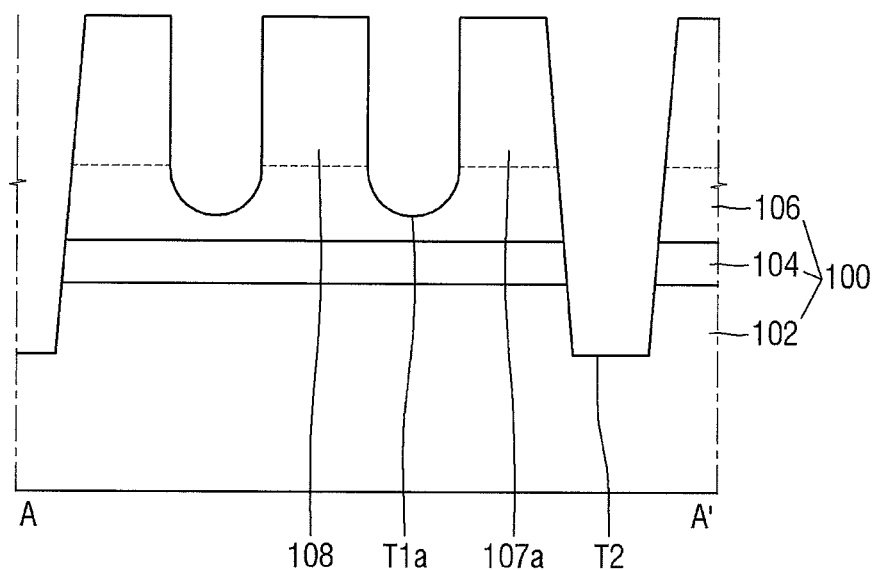
Figure 9B:
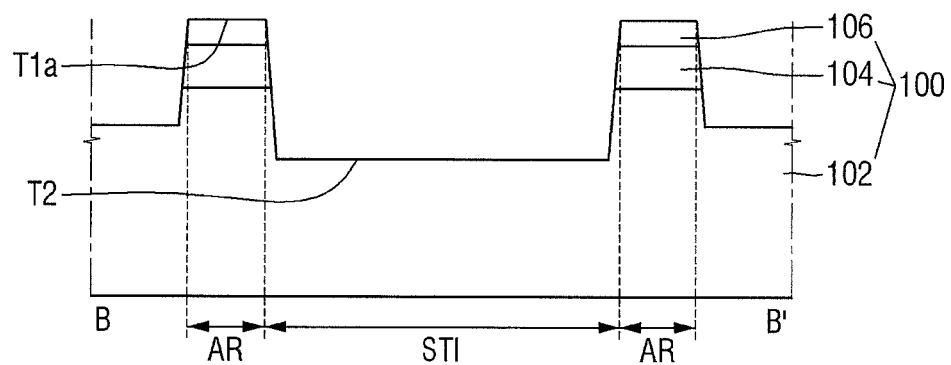

Referring to FIGS. 1, 9A and 9B, a second trench T2 is formed in the lower semiconductor layer 102, the buried insulating layer 104 and the upper semiconductor layer 106. The unit active region AR and the element isolation region STI may be defined by the second trench T2.

Specifically, the remaining region of the substrate 100 excluding the unit active region AR of FIG. 1 may be etched to form the second trench T2. That is, the region of the substrate 100 on which the second trench T2 is formed may be defined as an element isolation region STI, and the region of the substrate 100 on which the first trench T1a is formed may be defined as the unit active region AR.

Figure 10A:
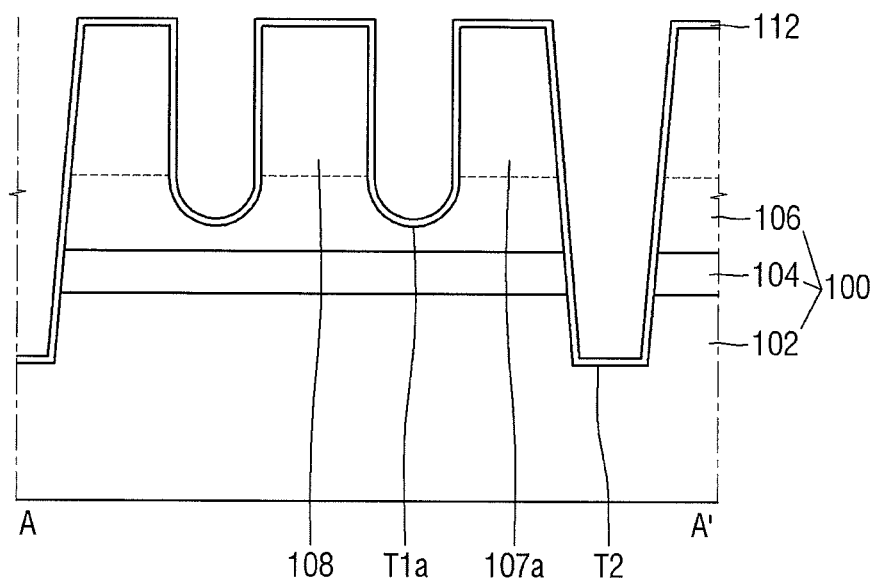
Figure 10B:
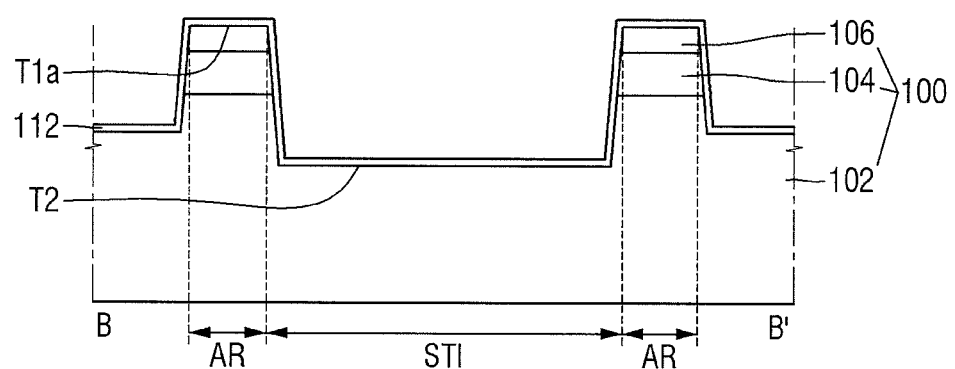

Referring to FIGS. 1, 10A and 10B, a first insulating layer 112 is formed on the upper semiconductor layer 106, the first trench T1a, and the second trench T2. The first insulating layer 112 may be conformally formed along the upper semiconductor layer 106, the first trench T1a and the second trench T2.

The first insulating layer 112 may include at least one of a silicon oxide film, a silicon nitride film, a silicon oxynitride film or a high-dielectric constant material. Here, the high-dielectric constant material may include, for example, at least one of HfO2, ZrO2, or Ta2O5, but the present inventive concept is not limited thereto.

Figure 11A:
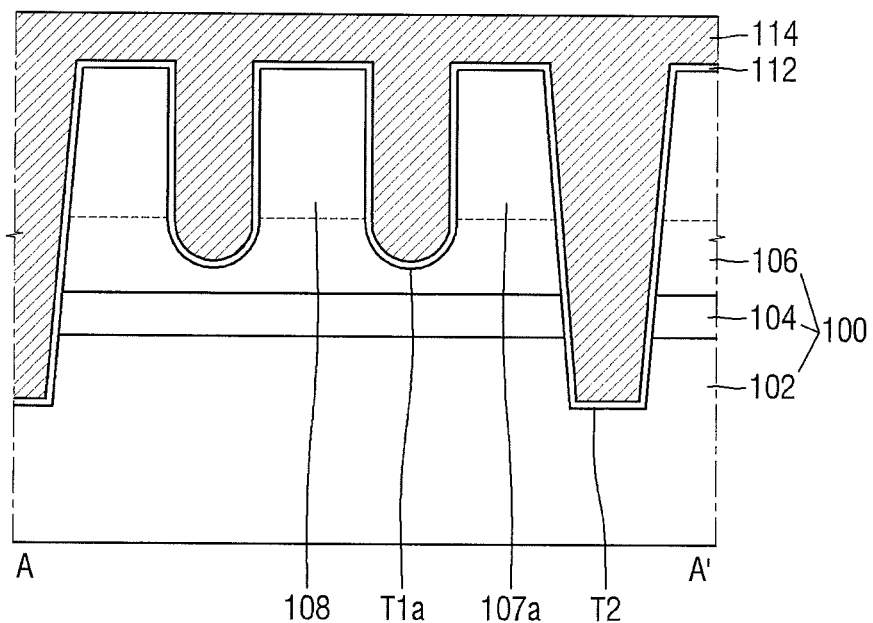
Figure 11B:
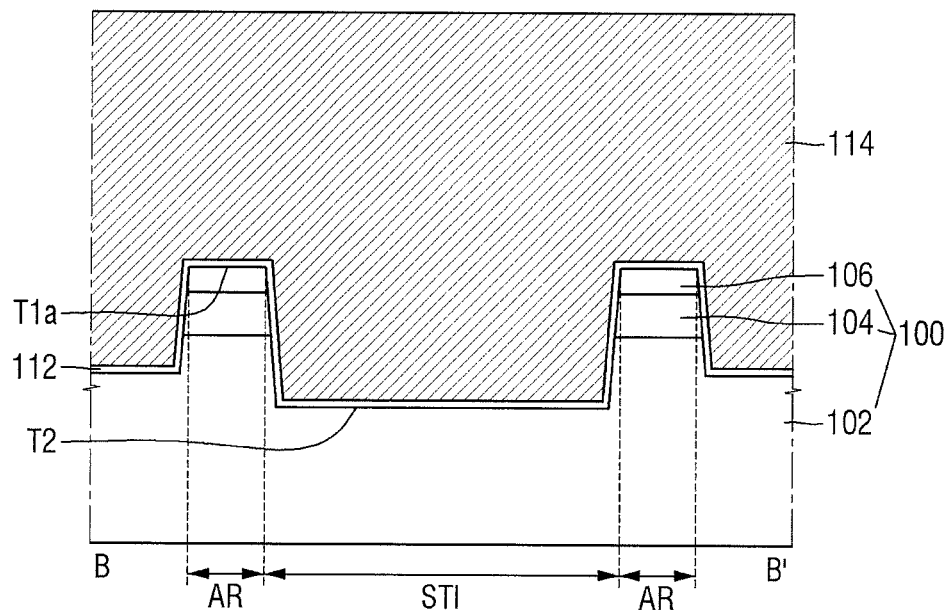

Referring to FIGS. 1, 11A and 11B, a first conductive layer 114 is formed on the first insulating layer 112. The first conductive layer 114 may be formed to fill the first trench T1a and the second trench T2.

The first conductive layer 114 may include a conductive material. For example, the first conductive layer 114 may include metal, polysilicon or the like, but the present inventive concept is not limited thereto. In some embodiments, the first conductive layer 114 may include metal nitride.

In the method for fabricating a semiconductor device according to present embodiment, the process of forming the element isolation film 110 may be omitted. Thus, in the method for fabricating the semiconductor device according to the present embodiment, the fabricating cost may be reduced by simplifying the fabricating process.

However, the present inventive concept is not limited thereto, but a process of forming the element isolation film 110 for filling the second trench T2 may be further included, before forming the first conductive layer 114. In some embodiments of the method for fabricating the semiconductor device, the second trench T2 may be formed before forming the first trench T1a. Thus, the element isolation film 110 may be formed before forming the first trench T1a.

Figure 12A:
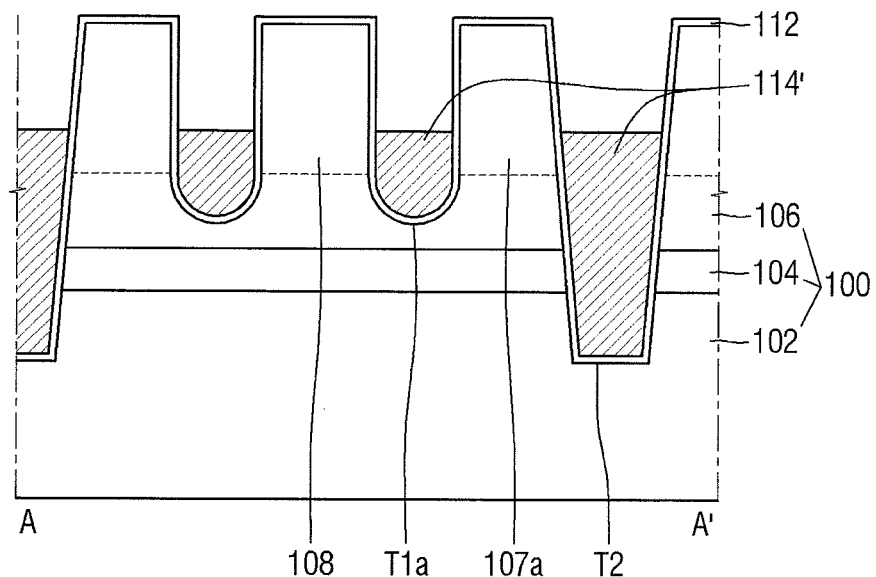
Figure 12B:
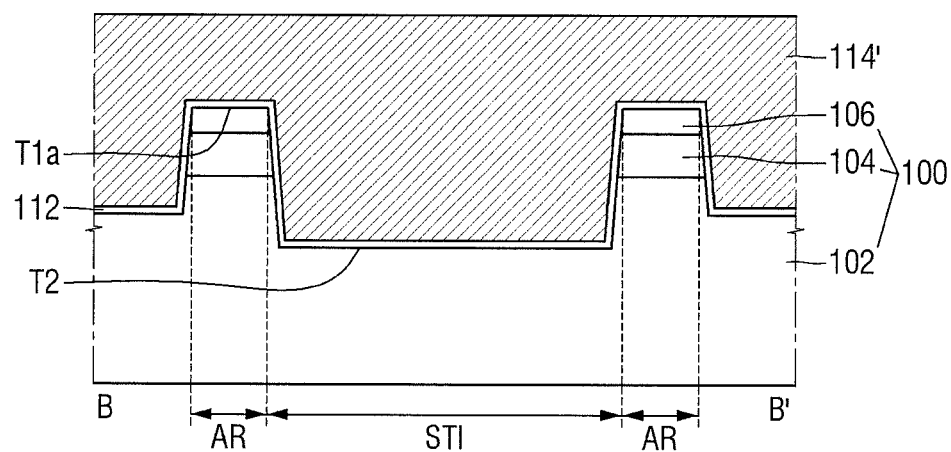

Referring to FIGS. 1, 12A and 12B, the first conductive layer 114 is etched to form an etched first conductive layer 114'. Specifically, the first conductive layer 114 may be etched so that the upper surface of the etched first conductive layer 114' is lower than the upper surface of the upper semiconductor layer 106.

The etched first conductive layer 114' may be formed using an etch-back process. For example, the etched first conductive layer 114' may be formed, using a metal etch-back (MEB) process, but the present inventive concept is not limited thereto.

Figure 13A:
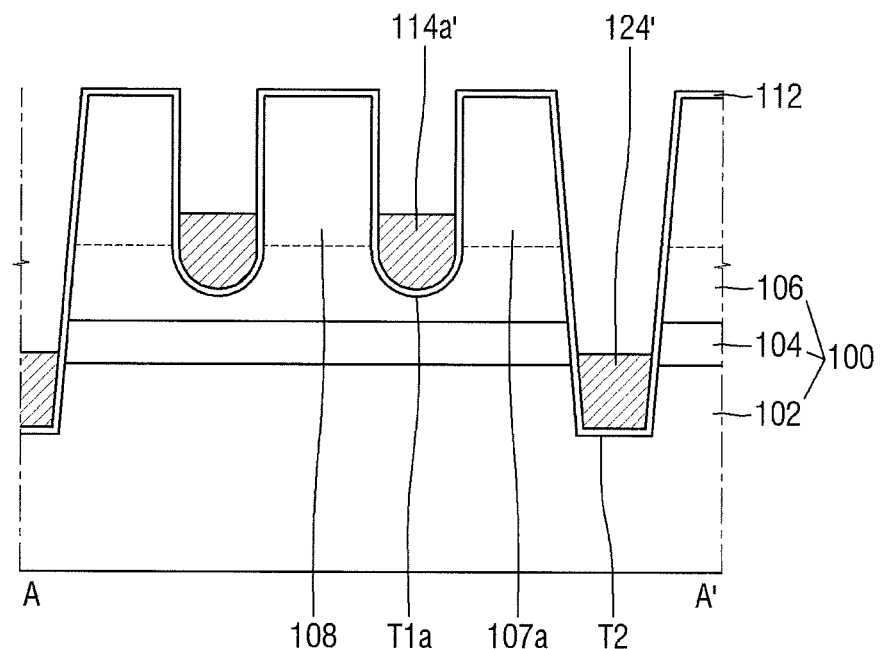
Figure 13B:
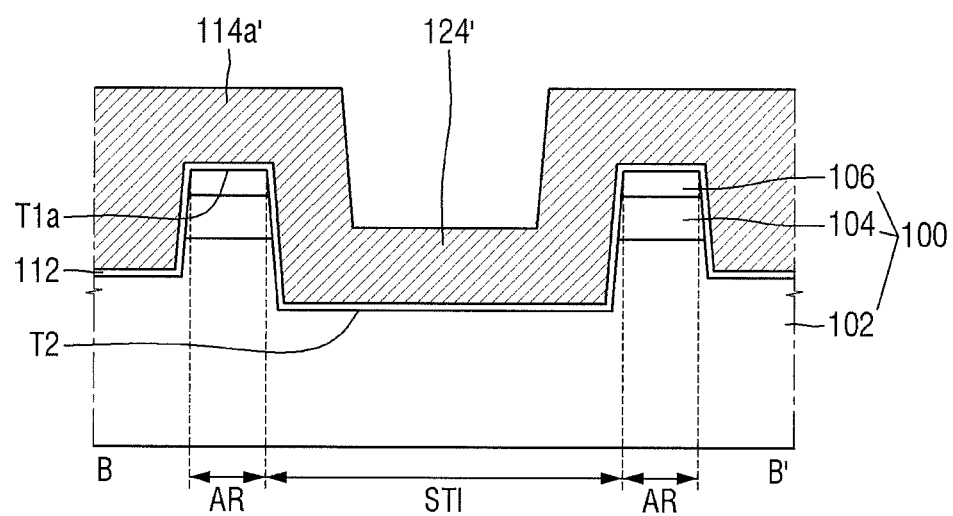

Referring to FIGS. 1, 13A and 13B, a portion of the etched first conductive layer 114' on the second trench T2 is further etched to form the first conductive patterns 114a' and the second conductive pattern 124'. Specifically, the etched first conductive layer 114' is etched so that the upper surface of the second conductive pattern 124' is lower than the upper surface of the first conductive pattern 114a'.

That is, a part of the etched first conductive layer 114' of the element isolation region STI may be further etched to form a second conductive pattern 124' on the second trench T2. However, the etched first conductive layer 114' on the unit active region AR may not be etched. That is, the first conductive pattern 114a' may have substantially the same shape as the etched first conductive layer 114' on the first trench T1a of FIGS. 12A and 12B.

The first conductive pattern 114a' and the second conductive pattern 124' may be formed, using an etch-back process. For example, the first conductive pattern 114a' and the second conductive pattern 124' may be formed, using a metal etch-back (MEB) process, but the present inventive concept is not limited thereto.

Figure 14A:
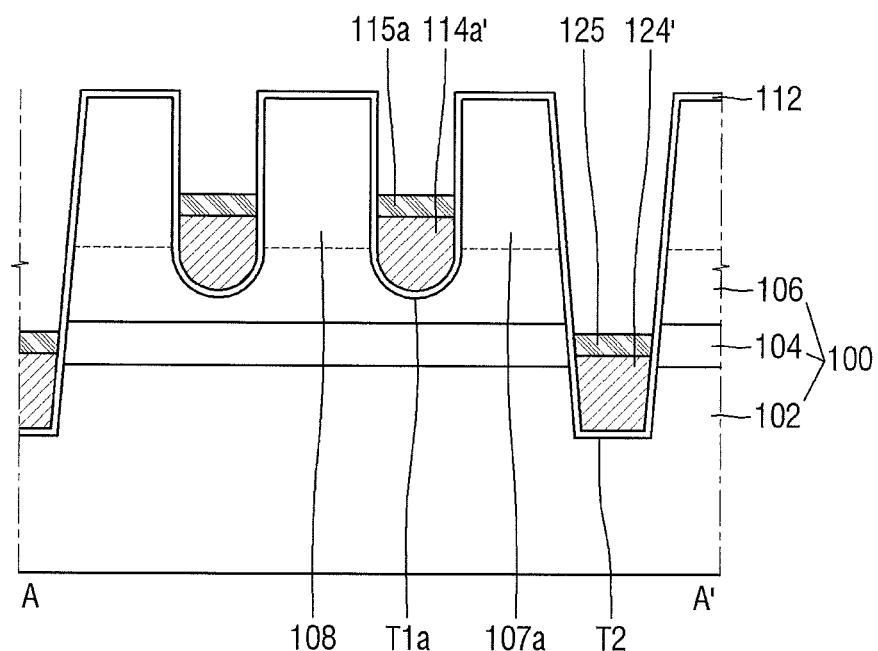
Figure 14B:
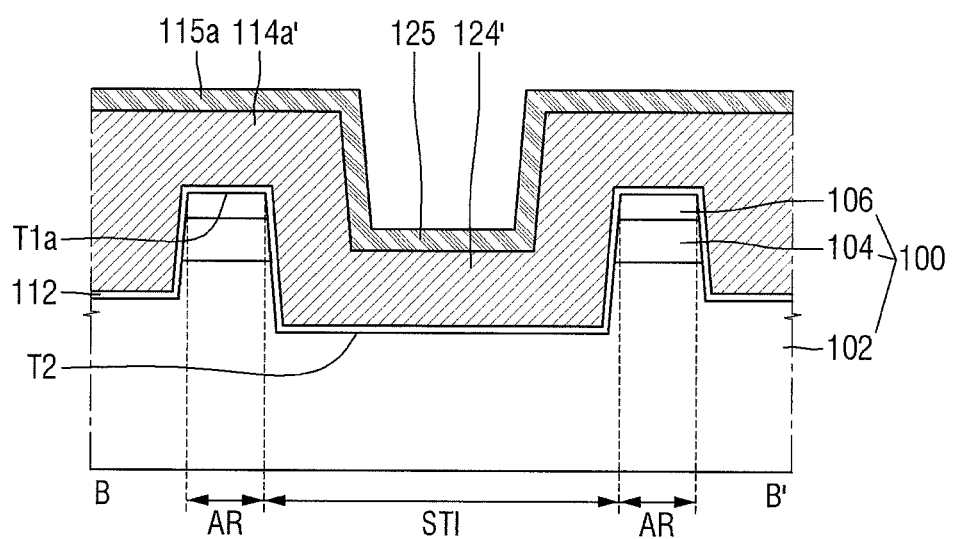

Referring to FIGS. 1, 14A and 14B, a fifth conductive pattern 115a is formed on the first conductive pattern 114a', and a sixth conductive pattern 125 is formed on the second conductive pattern 124'.

Formation of the fifth conductive pattern 115a and the sixth conductive pattern 125 may be substantially the same as that of the first conductive pattern 114a' and the second conductive pattern 124'. For example, formation of the fifth conductive pattern 115a and the sixth conductive pattern 125 may include formation of a second conductive layer on the structures of FIGS. 13A and 13B. Subsequently, by using a metal etch-back (MEB) process, a fifth conductive pattern 115a may be formed on the first conductive pattern 114a' and a sixth conductive pattern 125 may be formed on the second conductive pattern 124a'. Here, the second conductive layer may include a conductive material. In some embodiments, the second conductive layer may include a metal nitride or metal carbide.

Figure 15:
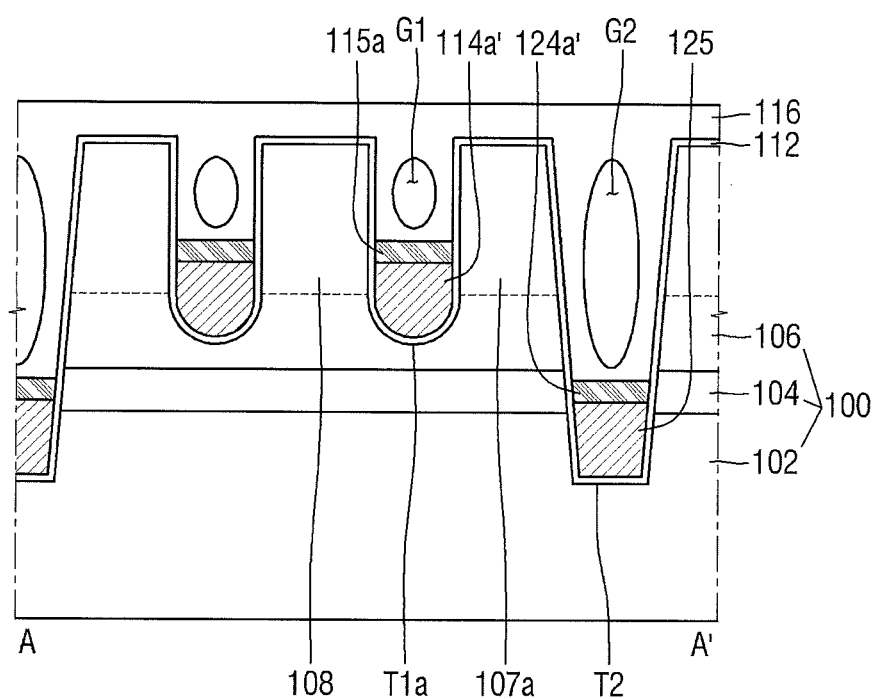

Referring to FIG. 15, the second insulating layer 116 is formed on the structures of FIGS. 14A and 14B. The second insulating layer 116 may be formed to fill the first trench T1a and the second trench T2.

The second insulating layer 116 may include, for example, an oxide film, a nitride film, an oxynitride film, or a combination thereof, but the present inventive concept is not limited thereto.

In some embodiments, as illustrated in FIG. 15, a second insulating layer 116 including the first air gap G1 and the second air gap G2 may be formed. Formation of the second insulating layer 116 including the first air gap G1 and the second air gap G2 may include a rough formation of the second insulating layer 116. For example, when depositing the second insulating layer 116, the second insulating layer 116 including the first air gap G1 and the second air gap G2 may be formed by adjusting the deposition rate. In some embodiments, the first trench T1a and the second trench T2 may be very small. In such a case, when the second insulating layer 116 is deposited at a rapid rate, the second insulating layer 116 may not completely fill the first trench T1a, and may form the first air gap G1 on the first trench T1a. Likewise, the second insulating layer 116 may not completely fill the second trench T2, and may form the second air gap G2 on the second trench T2. However, the present inventive concept is not limited thereto.

The second insulating layer 116 including the first air gap G1 and the second air gap G2 may be formed using a sacrificial layer. For example, the second insulating layer 116 is formed, a sacrificial film is formed, and the sacrificial film is removed, thereby forming the second insulating layer 116 including the first air gap G1 and the second air gap G2.

Figure 16:
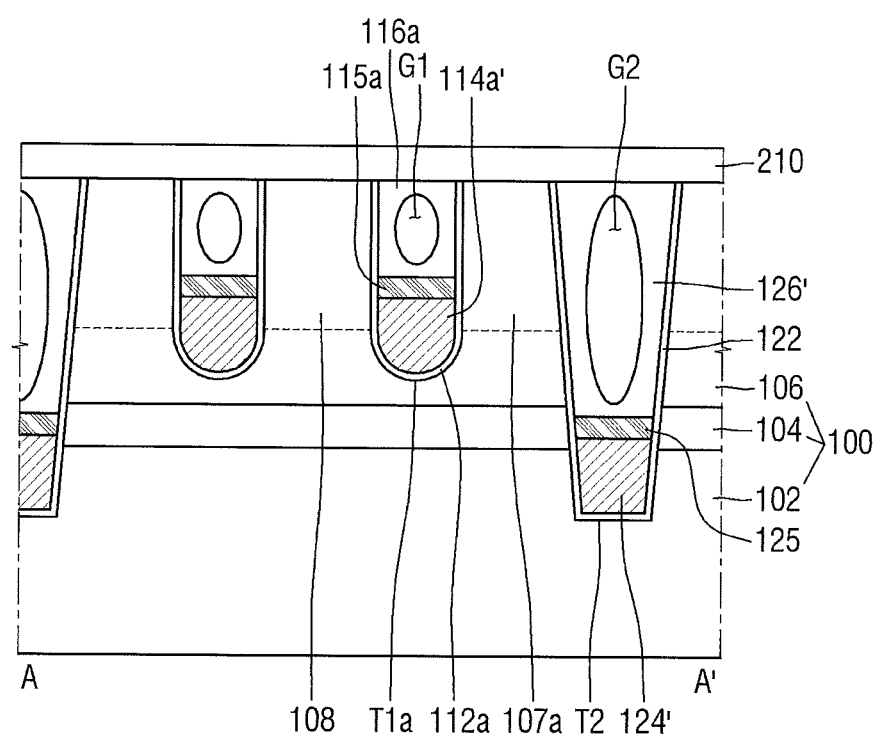

Referring to FIG. 16, a planarization process is performed on the result of FIG. 15 to form a first interlayer insulating layer 210.

Specifically, the planarization process may be performed until the upper surface of the upper semiconductor layer 106 is exposed. That is, the planarization process may be performed, until the second insulating layer 116 on the upper surface of the upper semiconductor layer 106 is removed. Thus, the first gate insulating layer 112a and the first capping layer 116a may be formed on the first trench T1a. Similarly, a second gate insulating layer 122 and a second capping layer 126' may be formed on the second trench T2.

Although the planarization process may use a chemical mechanical polishing (CMP) process, the present inventive concept is not limited thereto.

Subsequently, the first interlayer insulating layer 210 may be formed on the structure of FIG. 15 resulting from the planarization process.

Figure 17:
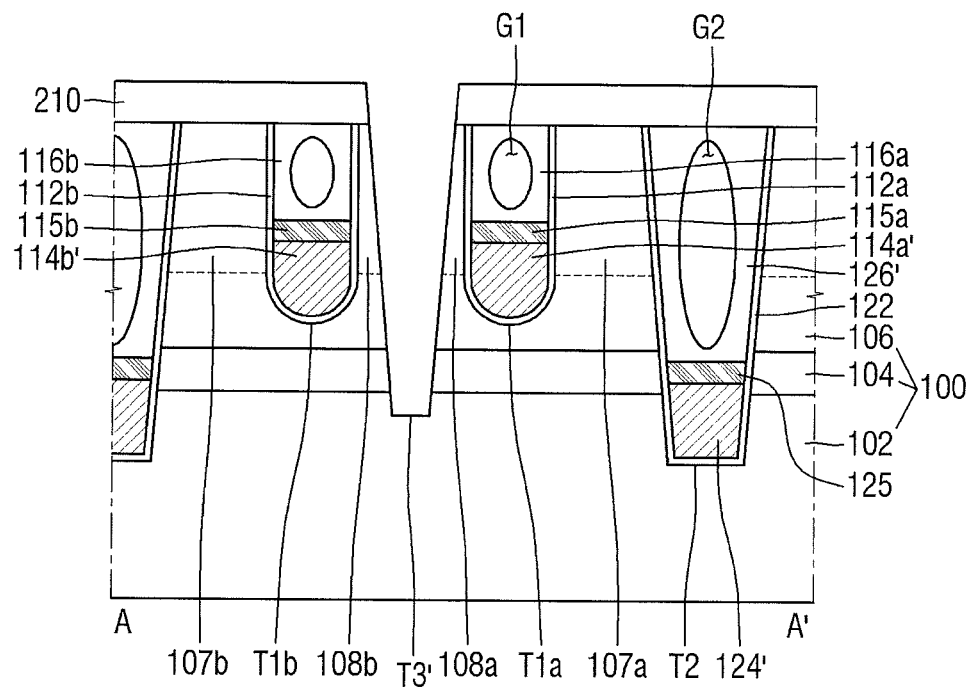

Referring to FIG. 17, a third trench T3' is formed inside the lower semiconductor layer 102, the buried insulating layer 104 and the upper semiconductor layer 106.

Specifically, some of the first interlayer insulating layer 210, the lower semiconductor layer 102, the buried insulating layer 104, and the upper semiconductor layer 106 may be etched to form the third trench T3'. The third trench T3' may be formed, using an etching process. For example, the third trench T3' may be formed, using a dry etching process.

Figure 18:
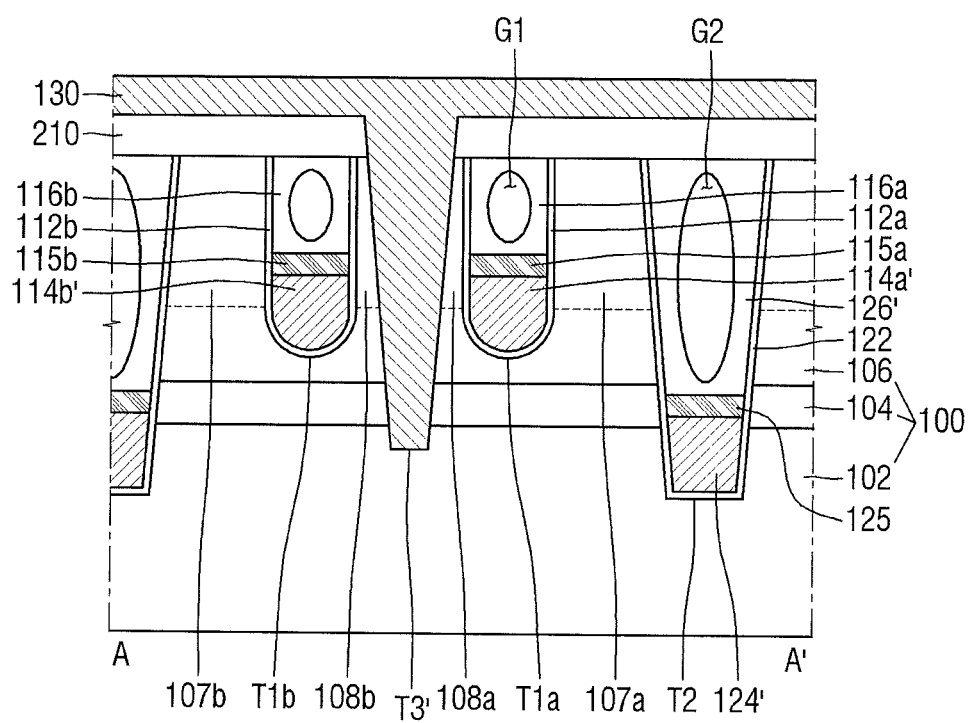

Referring to FIG. 18, the third conductive layer 130 is formed on the third trench T3' and the first interlayer insulating layer 210. The third conductive layer 130 may be formed to bury the third trench T3'.

The third conductive layer 130 may include a conductive material. For example, the third conductive layer 130 may include metal, polysilicon, or the like, but the present inventive concept is not limited thereto.

Subsequently, the third conductive layer 130 may be patterned to form the third conductive pattern 130' of FIG. 6. Subsequently, a bit line BL, a second interlayer insulating layer 220, a buried contact 310, a third interlayer insulating layer 230, a landing pad 320 and a capacitor 400 may be formed to fabricate the semiconductor device according to FIG. 6.

While the present inventive concept has been particularly illustrated and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed:
1. A method of fabricating a semiconductor device, the method comprising:
 providing a substrate comprising a lower semiconductor layer, an upper semiconductor layer on the lower semiconductor layer, and a buried insulating layer between the lower semiconductor layer and the upper semiconductor layer;

forming a source/drain region in a part of the upper semiconductor layer;

forming a first trench in the upper semiconductor layer, on one side of the source/drain region;

forming a first conductive pattern filling a part of the first trench;

forming a second trench in the lower semiconductor layer, the buried insulating layer, and the upper semiconductor layer, on the other side of the source/drain region;

forming a second conductive pattern filling at least a part of the second trench; and forming a unit active region and an element isolation region defining the unit active region, in the substrate, wherein the first trench is formed in the unit active region of the substrate, and wherein the second trench is formed in the element isolation region in the substrate.

2. The method of claim 1, wherein the element isolation region is not formed in the second trench, after forming the second trench.

3. A method of fabricating a semiconductor device, the method comprising:

providing a substrate comprising a lower semiconductor layer, an upper semiconductor layer on the lower semiconductor layer, and a buried insulating layer between the lower semiconductor layer and the upper semiconductor layer;

forming a source/drain region in a part of the upper semiconductor layer;

forming a first trench in the upper semiconductor layer, on one side of the source/drain region, forming a first conductive pattern filling a part of the first trench;

forming a second trench in the lower semiconductor layer, the buried insulating layer, and the upper semiconductor layer, on the other side of the source/drain region; and forming a second conductive pattern filling at least a part of the second trench, wherein the first trench has a lowest surface above the buried insulating layer.

4. A method of fabricating a semiconductor device, the method comprising:

providing a substrate comprising a lower semiconductor layer, an upper semiconductor layer on the lower semiconductor layer, and a buried insulating layer between the lower semiconductor layer and the upper semiconductor layer;

forming a first trench in the upper semiconductor layer, the first trench having a lowest surface above the buried insulating layer;

forming a first conductive pattern recessed in the first trench;

forming a second trench in the lower semiconductor layer, the buried insulating layer, and the upper semiconductor layer;

forming a second conductive pattern in the second trench; and forming a first source/drain region in the upper semiconductor layer between the first conductive pattern and the second conductive pattern.

5. The method of claim 4, further comprising forming a gate insulating layer on a sidewall and a bottom surface of the second trench, wherein the second conductive pattern is on the gate insulating layer.

6. The method of claim 5, wherein an upper surface of the second conductive pattern is lower than an uppermost surface of the first conductive pattern.

7. The method of claim 6, wherein an uppermost surface of the second conductive pattern is lower than an upper surface of the buried insulating layer.

8. The method of claim 5, further comprising forming a capacitor on the substrate, wherein the first source/drain region is electrically connected to the capacitor.

9. The method of claim 5, further comprising:

forming a third trench in the lower semiconductor layer, the buried insulating layer, and the upper semiconductor layer;

forming a third conductive pattern in the third trench; and forming a second source/drain region in the upper semiconductor layer between the first conductive pattern and the third conductive pattern, wherein the first conductive pattern is interposed between the first source/drain region and the second source/drain region.

10. The method of claim 5, further comprising forming a third conductive pattern on the second conductive pattern, wherein the second conductive pattern has a work function that is higher than a work function of the third conductive pattern.

11. The method of claim 5, further comprising forming a capping layer on the second conductive pattern, wherein the capping layer includes an air gap.

12. The method of claim 4, wherein the second conductive pattern is electrically connected to the first source/drain region.

13. The method of claim 12, wherein an upper surface of the second conductive pattern is higher than or equal to an upper surface of the upper semiconductor layer, and wherein a lower surface of the second conductive pattern is lower than or equal to an upper surface of the lower semiconductor layer.

* * * * *